United States Patent
Baek et al.

(10) Patent No.: US 12,034,008 B2
(45) Date of Patent: Jul. 9, 2024

(54) SEMICONDUCTOR DEVICE HAVING ACTIVE FIN PATTERN AT CELL BOUNDARY

(71) Applicant: SAMSUNG ELECTRONICS CO., LTD., Suwon-si (KR)

(72) Inventors: Sanghoon Baek, Seoul (KR); Jungho Do, Suwon-si (KR); Jaewoo Seo, Seoul (KR); Jisu Yu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/336,754

(22) Filed: Jun. 16, 2023

(65) Prior Publication Data

US 2023/0335559 A1  Oct. 19, 2023

Related U.S. Application Data

(63) Continuation of application No. 17/200,179, filed on Mar. 12, 2021, now Pat. No. 11,705,456.

(30) Foreign Application Priority Data

Aug. 21, 2020 (KR) ........................ 10-2020-0105218

(51) Int. Cl.
*H01L 27/02* (2006.01)
*H01L 23/48* (2006.01)
*H01L 27/118* (2006.01)

(52) U.S. Cl.
CPC ...... *H01L 27/11807* (2013.01); *H01L 23/481* (2013.01); *H01L 27/0207* (2013.01); *H01L 2027/11829* (2013.01); *H01L 2027/11864* (2013.01); *H01L 2027/11881* (2013.01)

(58) Field of Classification Search
CPC ............. H01L 27/11807; H01L 23/481; H01L 27/0207; H01L 2027/11829; H01L 2027/11864; H01L 2027/11881; H01L 27/0886; H01L 27/0924; H01L 27/10826; H01L 27/10876; H01L 27/1211; H01L 29/41791; H01L 29/66795; H01L 29/785
See application file for complete search history.

(56) References Cited

U.S. PATENT DOCUMENTS

| | | |
|---|---|---|
| 6,849,906 B2 | 2/2005 | Maeno et al. |
| 7,302,660 B2 | 11/2007 | Shimamura |
| 9,817,937 B2 | 11/2017 | Suzuki et al. |
| 10,090,325 B1 | 10/2018 | Liaw |
| 10,249,605 B2 | 4/2019 | Subhash et al. |
| 10,268,793 B2 | 4/2019 | Lee et al. |
| 10,297,596 B2 | 5/2019 | Sharma et al. |
| 10,734,478 B2 | 8/2020 | Liaw |

(Continued)

FOREIGN PATENT DOCUMENTS

KR  10-2019-0087752 A  7/2019

*Primary Examiner* — Eduardo A Rodela
(74) *Attorney, Agent, or Firm* — Sughrue Mion, PLLC

(57) ABSTRACT

A semiconductor device includes a first standard cell disposed on a substrate in a first row and having a first cell height; a second standard cell disposed on the substrate in a second row, adjacent to the first row, second standard cell having a second cell height, different from the first cell height; and a power line extending in a first direction along a boundary between the first standard cell and the second standard cell.

20 Claims, 19 Drawing Sheets

(56) References Cited

U.S. PATENT DOCUMENTS

| | | |
|---|---|---|
| 10,879,174 B2 * | 12/2020 | Liaw ................. H01L 21/76816 |
| 10,998,340 B2 | 5/2021 | Guo et al. |
| 11,075,208 B2 | 7/2021 | Liaw |
| 11,094,695 B2 | 8/2021 | Liaw |
| 11,476,278 B2 | 10/2022 | Liaw |
| 11,675,952 B2 * | 6/2023 | Peng .................... G06F 30/398 |
| | | 716/120 |
| 11,741,285 B2 * | 8/2023 | Yang .................... G06F 30/392 |
| | | 716/120 |
| 11,842,964 B2 * | 12/2023 | Do .................... H01L 29/78696 |
| 2013/0313615 A1 | 11/2013 | Tzeng et al. |
| 2016/0147926 A1 | 5/2016 | Chiang et al. |
| 2019/0164949 A1 | 5/2019 | Sio et al. |
| 2020/0006481 A1 | 1/2020 | Yang et al. |
| 2020/0058681 A1 | 2/2020 | Lai et al. |
| 2020/0104462 A1 | 4/2020 | Chen et al. |
| 2020/0119048 A1 | 4/2020 | Guo et al. |
| 2020/0273851 A1 | 8/2020 | Liaw |
| 2021/0066310 A1 | 3/2021 | Liaw |
| 2021/0210468 A1 * | 7/2021 | Takeno ............... H01L 23/5286 |
| 2021/0224457 A1 | 7/2021 | Guo et al. |
| 2021/0343744 A1 * | 11/2021 | Chiu .................. H01L 27/0207 |
| 2021/0391328 A1 | 12/2021 | Sio et al. |

* cited by examiner

SEMICONDUCTOR DEVICE HAVING ACTIVE FIN PATTERN AT CELL BOUNDARY

CROSS-REFERENCE TO RELATED APPLICATION

This is a Continuation of U.S. application Ser. No. 17/200,179 filed Mar. 21, 2021, which is based on and claims priority under 35 U.S.C. § 119 to Korean Patent Application No. 10-2020-0105218, filed on Aug. 21, 2020 in the Korean Intellectual Property Office, the disclosure of which is incorporated by reference herein in its entirety.

BACKGROUND

The disclosure relates to a semiconductor device.

As demands for high performance, high speed and/or multifunctionality in a semiconductor device increase, a degree of integration of the semiconductor device is increasing. In accordance with the trend toward a high degree of integration in semiconductor devices, research into the design of layouts, particularly efficient routing of wirings for connecting semiconductor devices, is being actively conducted.

SUMMARY

An aspect of the disclosure is to provide a semiconductor device having an improved degree of integration and improved reliability.

In accordance with an aspect of the disclosure, a semiconductor device includes a first standard cell disposed on a substrate in a first row, the first standard cell having a first cell height; a second standard cell disposed on the substrate in a second row adjacent to the first row, the second standard cell having a second cell height different from the first cell height; and a power line extending in a first direction along a boundary between the first standard cell and the second standard cell, wherein the first standard cell includes a first base active region surrounded by a device isolation layer; and a plurality of first fin patterns disposed on the first base active region and extending in the first direction, wherein the second standard cell includes a second base active region surrounded by the device isolation layer; and a plurality of second fin patterns disposed on the second base active region and extending in the first direction, wherein the device isolation layer is disposed between the first base active region and the second base active region, and wherein a central line of the power line and a central line of the device isolation layer are offset in a second direction, perpendicular to the first direction, the central line of the power line and the central line of the device isolation layer extending in the first direction.

In accordance with an aspect of the disclosure, a semiconductor device includes a first standard cell and a second standard cell, the first standard cell and the second standard cell being disposed on a substrate and sharing a boundary with each other, each of the first standard cell and the second standard cell including a base active region, a plurality of fin patterns disposed on the base active region and extending in a first direction, a gate structure intersecting the plurality of fin patterns and extending in a second direction perpendicular to the first direction, a plurality of source/drain regions disposed on the plurality of fin patterns on both sides of the gate structure, and a contact structure connected to the plurality of source/drain regions and extending in a vertical direction, respectively; and a power line overlapping the boundary between the first standard cell and the second standard cell, the power line extending in the first direction and supplying power to the first standard cell and the second standard cell, wherein the plurality of fin patterns of the first standard cell includes an external fin pattern overlapping the power line in the vertical direction, wherein the power line is a buried power line at least partially buried in the base active region, wherein the contact structure includes an extension portion connected to a source/drain region of the plurality of source/drain regions that is disposed on the external fin pattern and the buried power line, and wherein the extension portion extends in the second direction across the boundary between the first standard cell and the second standard cell.

In accordance with an aspect of the disclosure, A semiconductor device includes a substrate having a base active region; a plurality of standard cells, each standard cell of the plurality of standard cells including a plurality of fin patterns disposed on the base active region of the substrate and extending in a first direction; a gate structure intersecting the plurality of fin patterns and extending in a second direction intersecting the first direction; and a plurality of source/drain regions disposed on both sides of the gate structure and on the plurality of fin patterns; and a plurality of power lines, each power line of the plurality of power lines extending in the first direction along boundaries between adjacent standard cells of the plurality of standard cells and supplying power to the plurality of standard cells, wherein the plurality of standard cells includes a first standard cell and a second standard cell, wherein the first standard cell includes a first PMOS transistor region and a first NMOS transistor region, the first PMOS transistor region having a height in the second direction different from a height of the first NMOS transistor region, wherein the second standard cell includes a second PMOS transistor region and a second NMOS transistor region, the second PMOS transistor region having a height in the second direction different from a height of the second NMOS transistor region, wherein a first cell height of the first standard cell in the second direction is substantially equal to a sum of the height of the first PMOS transistor region and the height of the first NMOS transistor region, wherein a second cell height of the second standard cell in the second direction is substantially equal to a sum of the height of the second PMOS transistor region and the height of the second NMOS transistor region, and wherein no dummy fin pattern is disposed on at least one of an entire boundary of the first standard cell and an entire boundary of the second standard cell.

BRIEF DESCRIPTION OF DRAWINGS

The above and other aspects, features, and advantages of certain embodiments of the disclosure will be more apparent from the following detailed description, taken in conjunction with the accompanying drawings, in which.

DETAILED DESCRIPTION

Hereinafter, embodiments of the disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
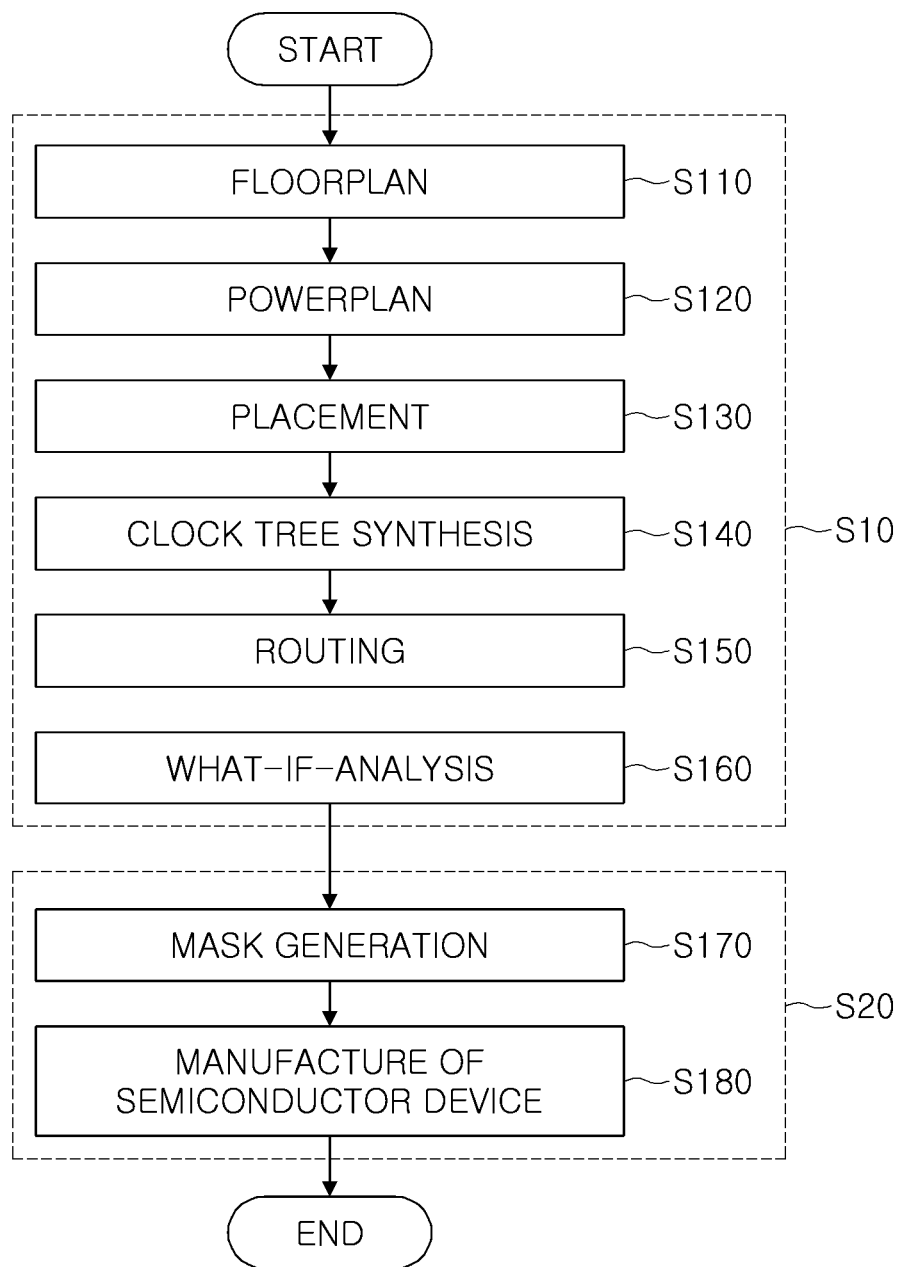
FIG. 1 is a flowchart illustrating a method of designing and manufacturing a semiconductor device according to an embodiment.

FIG. 1 is a flowchart illustrating a method of designing and manufacturing a semiconductor device according to example embodiments.

Referring to FIG. 1, a method of designing and manufacturing a semiconductor device according to this example embodiment may include operation S10 of designing and operation S20 of manufacturing a semiconductor device.

In operation S10, a layout for a circuit may be designed using a tool for designing the circuit. The tool may be a program including a plurality of instructions executed by a processor. Therefore, operation S10 may be a computer implemented operation for designing a circuit. In operation S20, a semiconductor device may be manufactured according to the designed layout based on a semiconductor process module.

First, operation S10 may include a floor plan (S110), a power plan (S120), a placement (S130), a clock tree synthesis (CTS) (S140), a routing (S150), and a what-if-analysis (S160).

In operation S110, a logically designed schematic circuit may be designed through, for example, cutting and moving the circuit. In operation S110, a memory or a functional block may be disposed. In this operation, for example, functional blocks to be arranged adjacent to each other may be identified, and a space for the functional blocks may be allocated in consideration of a space to be available and performance to be required. For example, operation S110 may include generating a site-row and forming a metal routing track on the generated site-row. The site-row may be a frame for arranging standard cells stored in a cell library according to a specified design rule. In the semiconductor device according to this example embodiment, standard cells respectively having a constant height level may be disposed in rows, and a portion of the rows may provide sites for disposing the standard cells having different height levels from other portions of the rows. The metal routing track may be an imaginary line on which wirings are formed later.

In operation S120, patterns of wirings for connecting a local power source, for example, a driving voltage, or a ground, to the arranged functional blocks may be disposed. For example, the patterns of wirings connecting a power source or a ground may be generated to evenly supply power to an entire chip to form a net. In this specification, the patterns may also be referred to as power rails or power lines. In this operation, the wirings may be generated to form a net by various rules.

In operation S130, patterns of elements constituting the functional block may be arranged. Operation S130 may include arranging the standard cells. Particularly, in example embodiments, each of the standard cells may include semiconductor devices and first wiring lines connected thereto. The first wiring lines may include a power transmission line for connecting a power source or a ground, and a wiring line for transmitting a control signal, an input signal, or an output signal. Blank regions may occur between the standard cells arranged in this operation, and the blank regions may be filled by filler cells. Unlike standard cells including an operable semiconductor device, a unit circuit implemented by the semiconductor device, or the like, the filler cells may be dummy regions. By this operation, a shape or a size of a pattern for configuring transistors and wirings to be actually formed on a semiconductor substrate may be defined. For example, to actually form an inverter circuit on a semiconductor substrate, layout patterns such as P-type metal oxide semiconductor (PMOS), N-type metal oxide semiconductor (NMOS), N-WELL, gate electrodes, and wirings to be disposed thereon may be appropriately arranged.

In operation S140, patterns of signal lines of a center clock related to a response time may be generated for determining performance of the semiconductor device. Subsequently, in operation S150, an upper wiring structure or a routing structure, including second wiring lines connecting the arranged standard cells may be generation. In particular, a power distribution network (PDN) may be implemented in this operation. The second wiring lines may be electrically connected to the first wiring lines in the standard cells, and may electrically connect the standard cells to each other, or may be connected to a power source or a ground. The second wiring lines may be configured to be physically formed on or above the first wiring lines.

In operation S160, the generated layout may be verified and corrected. Items to be verified may include a design rule check (DRC) verifying if a layout is properly done in accordance with design rules, an electrical rule check (ERC) verifying if a layout is properly done without electrical disconnection, a layout-vs-schematic (LVS) verifying if a layout matches a gate level net list, or the like.

Subsequently, operation S20 may include a mask generation (S170) and a manufacture of the semiconductor device (S180).

In operation S170, optical proximity correction (OPC) or the like may be performed on layout data generated in operation S10, to generate mask data for forming various patterns on a plurality of layers, and using the mask data to manufacture a mask. The optical proximity correction may be for correcting a distortion phenomenon that may occur in a photolithography process. The mask may be manufactured in a manner depicting layout patterns using a chromium thin film applied to a glass substrate or a quartz substrate.

In operation S180, various types of exposure and etching processes may be repeatedly performed. Patterns made in designing a layout may be sequentially formed on a semiconductor substrate such as silicon by these processes. Specifically, various semiconductor processes on a semiconductor substrate such as a wafer using a plurality of masks may be performed to form a semiconductor device having an integrated circuit. The semiconductor process employed in this embodiment may be performed by a lithography process using light such as extreme ultraviolet (EUV). Since a mask may be manufactured using the lithography process, a pitch, an interval, and/or a linear width of the patterns may be freely set. In addition, the semiconductor process may include a deposition process, an etching process, an ion process, a cleaning process, and the like. In addition, the semiconductor process may include a packaging process of mounting a semiconductor device on a printed circuit board (PCB) and sealing the mounted semiconductor device with a sealing material, or a testing process for the semiconductor device or its package.

Figure 2:
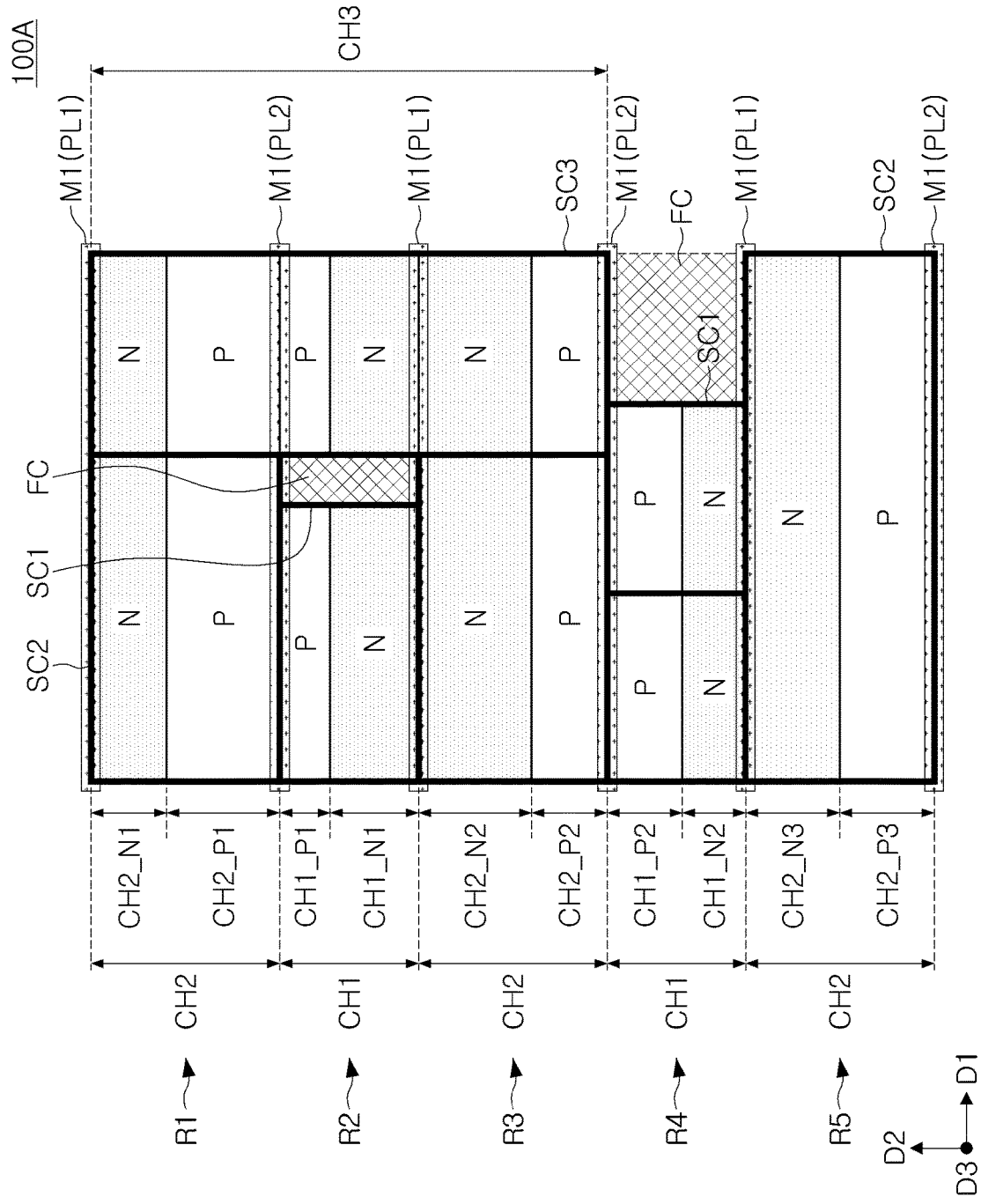
FIG. 2 is a plan view schematically illustrating a semiconductor device according to an embodiment.

FIG. 2 is a plan view schematically illustrating a semiconductor device according to example embodiments.

Referring to FIG. 2, a semiconductor device 100A may include standard cells SC1 and SC2 and filler cells FC provided as dummy regions. The standard cells SC1 and SC2 may be arranged in five rows arranged in a column direction, e.g., in first to fifth rows R1, R2, R3, R4, and R5. As shown in FIG. 2, the rows R1 to R5 may extend in a first direction D1 and the column may extend in a second direction D2. The filler cells FC may be disposed between the standard cells SC1 and SC2 to provide a dummy region.

The standard cells SC1 and SC2 arranged in the first to fifth rows R1, R2, R3, R4, and R5 may have constant cell heights CH1 and CH2 defined in the second direction D2, respectively. Cell heights of standard cells located in the same row may be the same, but standard cells located in some rows may have cell heights different than cell heights of standard cells located in other rows. For example, standard cells arranged in the second and fourth rows R2 and R4 may have a first cell height CH1, and standard cells arranged in the first, third, and fifth rows R1, R3, and R5 may have a second cell height CH2. The first cell height CH1 may be smaller than the second cell height CH2.

The semiconductor device 100A may include a third standard cell SC3 disposed over two or more adjacent rows. A cell height of the third standard cell SC3 may be the sum of cell heights of adjacent rows. For example, in FIG. 2, a third cell height CH3 of the third standard cell SC3 may be substantially equal to the sum of the first cell height CH1 and twice the second cell height CH2. According to embodiments, the third standard cell SC3 may have a cell height substantially equal to the sum of the first cell height CH1 and the second cell height CH2.

In this specification, the term "height" (e.g., "cell height") used in relation to a standard cell may mean a length or a distance in the second direction D2 when viewed from a plan view.

First and second power lines M1 (PL1) and M1 (PL2), supplying power to the standard cells SC1 and SC2, may extend in the first direction D1 along boundaries of the standard cells SC1 and SC2. The first and second power lines M1 (PL1) and M1 (PL2) may be arranged to be spaced apart from each other in the second direction D2. Each of the first and second power lines M1 (PL1) and M1 (PL2) may supply different potentials to the standard cells SC1 and SC2 located therebetween. Among the first and second power lines M1 (PL1) and M1 (PL2), a power line disposed at a boundary between standard cells SC1 and SC2 in two adjacent rows may be a power line shared by the adjacent standard cells SC1 and SC2. At least one of the first and second power lines M1 (PL1) and M1 (PL2) may be disposed to intersect at least one of the standard cells SC1 and SC2 and the filler cells FC.

Each of the standard cells SC1 and SC2 may have a P-type device region P and an N-type device region N, arranged in the column direction, e.g., the second direction D2. Standard cells located in adjacent two rows, among the first to fifth rows R1, R2, R3, R4, and R5, may be arranged such that the same conductivity type device regions are disposed to be adjacent to each other. For example, the standard cells SC1 and SC2 of the second and third rows R2 and R3 may be arranged such that the N-type device regions N are disposed to be adjacent to each other. In other words, the N-type device region N of the standard cell in the second row R2 may be adjacent to the N-type device region N of the standard cell in the third row R3. The P-type device region may be a region in which a PMOS transistor is disposed, and the N-type device region may be a region in which an NMOS transistor is disposed.

The first cell height CH1 of the first standard cells SC1 arranged in the second row R2 may be substantially equal to the sum of a height level CH1_P1 of a first P-type device region and a height level CH1_N1 of a first N-type device region. The height level CH1_P1 of the first P-type device region may be different from the height level CH1_N1 of the first N-type device region.

The first cell height CH1 of the first standard cells SC1 arranged in the fourth row R4 may be substantially equal to the sum of a height level CH1_P2 of the first P-type device region and a height level CH1_N2 of the first N-type device region. The height level CH1_P2 of the first P-type device region may be different from the height level CH1_N2 of the first N-type device region.

The first cell height CH1 of the first standard cell SC1 may be defined based on the height level of the P-type device region and the height level of the N-type device region. In embodiments, first standard cells SC1 having the same first cell height CH1 may have different heights of P-type device regions (CH1_P1 and CH1_P2), and may have different heights of the N-type device regions (CH1_N1 and CH1_N2). For example, the height CH1_N1 of the first N-type device region of the first standard cell SC1 arranged in the second row R2 may be different from the height CH1_N2 of the first N-type device region of the first standard cell SC1 arranged in the fourth row R4.

The second cell height CH2 of the second standard cells SC2 arranged in the first row R1 may be substantially equal to the sum of a height CH2_P1 of a second P-type device region and a height CH2_N1 of a second N-type device region. The height CH2_P1 of the second P-type device region may be different from the height CH2_N1 of the second N-type device region. Likewise, the second standard cells SC2 arranged in the third and fifth rows R3 and R5 may include a P-type device region and an N-type device region, having different heights, respectively.

In this specification, the height of the P-type device region may mean a length of a region in which a PMOS transistor is disposed in the second direction D2 within one standard cell when viewed from a plan view, and the height of the N-type device region may mean a length of a region in which an NMOS transistor is disposed in the second direction D2 within one standard cell when viewed from a plan view. The height of the P-type device region and the height of the N-type device region may be classified according to a length of an NWELL region formed in a substrate 101 having the p-type conductivity type in the second direction D2. The NWELL region will be described later with reference to FIGS. 8 and 10A-10C.

In embodiments of the disclosure, various heights of the standard cells may be determined according to the height of the P-type device region and the height of the N-type device region. The number of active fin patterns disposed in the P-type device region and the N-type device region may be determined accordingly.

In various embodiments of the disclosure, various height levels of the standard cells may be determined by a combination of the height level of the P-type device region and the height level of the N-type device region. For example, a standard cell having a cell height substantially equal to the sum of the height level CH1_P1 of the first P-type device region and the height level CH2_N1 of the second N-type device region may be provided. In another example, a standard cell having the same cell height as the sum of the height CH2_P2 of the second P-type device region and the height CH1_N1 of the first N-type device region may be provided.

Figure 3:
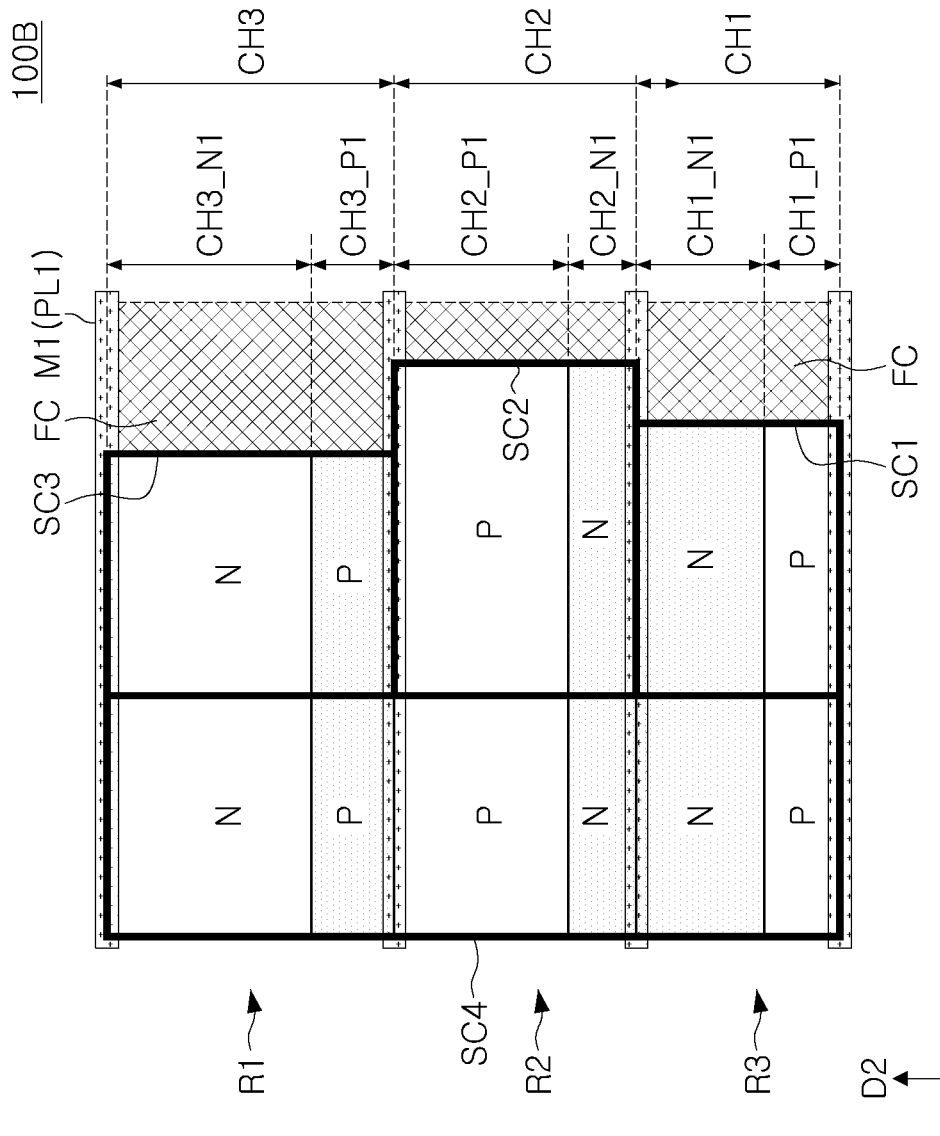
FIG. 3 is a plan view schematically illustrating a semiconductor device according to an embodiment.

FIG. 3 is a plan view schematically illustrating a semiconductor device according to example embodiments.

Referring to FIG. 3, a semiconductor device 100B may include standard cells SC1, SC2, and SC3 and a filler cell FC provided as a dummy region. Power lines M1 (PL1) and M1 (PL2) extending along boundaries of the standard cells SC1, SC2, and SC3 of the semiconductor device 100B in the first direction D1 may be arranged.

The standard cells SC1, SC2, and SC3 may include a first standard cell SC1, a second standard cell SC2, and a third standard cell SC3, arranged in three rows, e.g., in first to third rows R1, R2, and R3 in the second direction D2.

The first standard cell SC1, the second standard cell SC2, and the third standard cell SC3 may be sequentially arranged in the second direction D2. The first standard cell SC1 may have a first cell height CH1, the second standard cell SC2 may have a second cell height CH2, and the third standard cell SC3 may have a third cell height CH3. The first cell height CH1, the second cell height CH2, and the third cell height CH3 may be different from each other. For example, the first cell height CH1 may be greater than the second cell height CH2, and the second cell height CH2 may be greater than the third cell height CH3. As another example and as shown in FIG. 3, the first cell height CH1 may be less than the second cell height CH2, and the second cell height CH2 may be less than the third cell height CH3.

The semiconductor device 100B may include a fourth standard cell SC4 disposed over three or more adjacent rows. A cell height of the fourth standard cell SC4 may be the sum of cell heights of adjacent rows. For example, in FIG. 3, a fourth cell height CH4 of the fourth standard cell SC4 may be substantially equal to the sum of the first cell height CH1, the second cell height CH2, and the third cell height CH3.

In an example embodiment, standard cells SC1, SC2, and SC3, having the same cell height, may be arranged in the second direction D2, and standard cells having a cell height of M times the cell height (where M is a natural number) may be arranged in a semiconductor device.

Figures 4A, 4B:
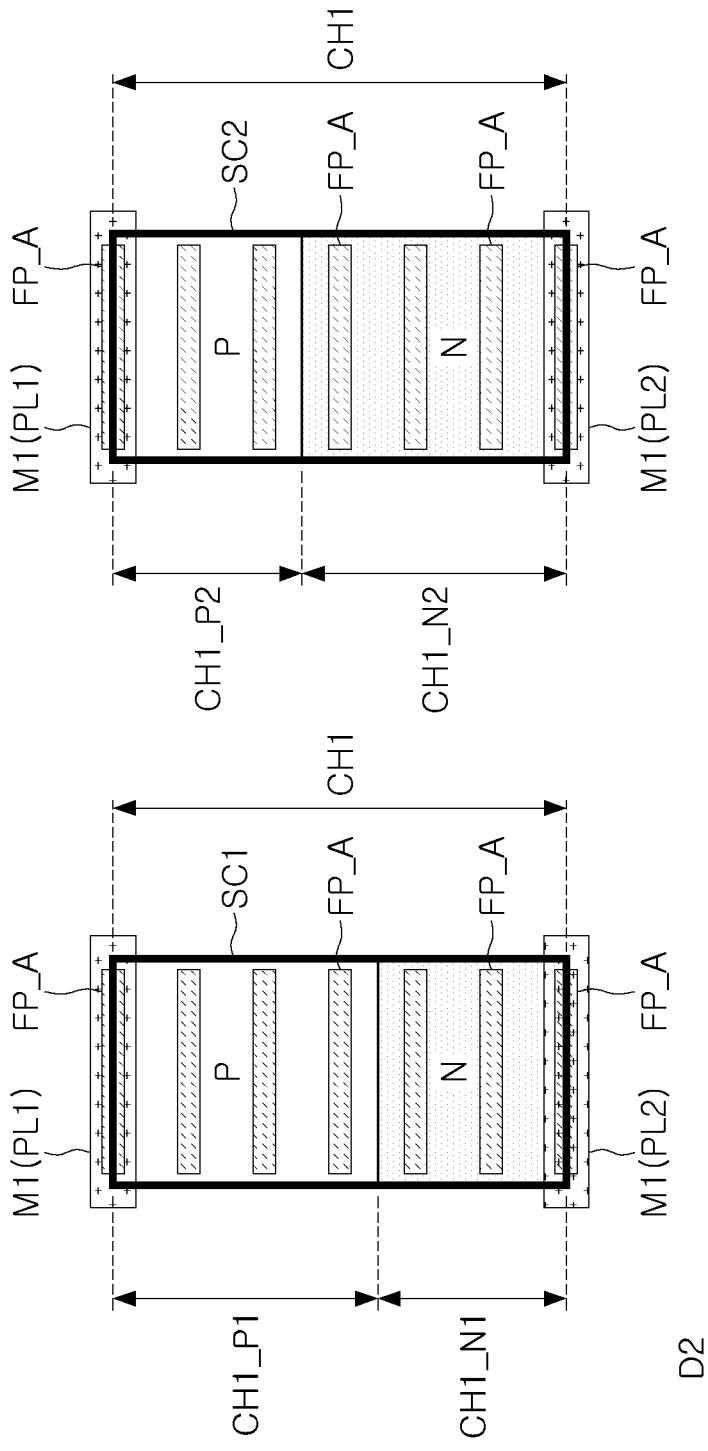
FIGS. 4A and 4B are plan views schematically illustrating semiconductor devices according to embodiments.

FIGS. 4A and 4B are plan views schematically illustrating a semiconductor device according to example embodiments. In FIGS. 4A and 4B, only some components constituting standard cells are illustrated for convenience of description.

In a semiconductor device, a first standard cell SC1 (FIG. 4A) and a second standard cell SC2 (FIG. 4B), having the same cell height CH1, may be arranged. For example, the first standard cell SC1 may be one of the standard cells arranged in the second row R2 of FIG. 2, and the second standard cell SC2 may be one of the standard cells arranged in the fourth row R4 of FIG. 2. The disclosure is not limited thereto, and the standard cells SC1 and SC2 described in FIGS. 4A and 4B may be standard cells arranged in the same row.

The first standard cell SC1 and the second standard cell SC2 may have the same first cell height CH1. Each of the first standard cell SC1 and the second standard cell SC2 may have a P-type device region and an N-type device region, disposed to be asymmetric to each other. For example, in the first standard cell SC1, a height level CH1_P1 of a first P-type device region may be different from a height CH1_N1 of a first N-type device region, and in the second standard cell SC2, a height CH1_P2 of a second P-type device region may be different from a height CH1_N2 of a second N-type device region.

Between the standard cells SC1 and SC2 having the same cell height, the P-type device region and the N-type device region may be asymmetric. For example, the height CH1_P1 of the first P-type device region of the first standard cell SC1 having the first cell height CH1 may be different from the height CH1_P2 of the second P-type device region of the second standard cell SC2 having the first cell height CH1.

FIGS. 4A and 4B illustrate an arrangement of fin patterns FP_A included in the standard cells SC1 and SC2. For example, in the first standard cell SC1, four (4) fin patterns FP_A may be arranged to be spaced apart from each other in the first P-type device region in the second direction D2, and three (3) fin patterns FP_A may be arranged to be spaced apart from each other in the first N-type device region in the second direction D2. The number of fin patterns FP_A arranged in one standard cell may vary according to embodiments, and, in one standard cell, the number of fin patterns FP_A arranged in the P-type device region may be different from the number of fin patterns FP_A arranged in the N-type device region.

The fin patterns FP_A may be arranged to have the substantially same interval and/or width. In example embodiments, some of the fin patterns FP_A may be arranged to have different intervals and/or widths.

Among the fin patterns FP_A, fin patterns FP_A arranged to overlap the power lines M1 (PL1) and M1 (PL2) may be active fin patterns. As described with reference to FIGS. 10A to 10C, the active fin patterns may perform a substantial function in the semiconductor device. For example, the fin patterns FP_A arranged to overlap the power lines M1 (PL1) and M1 (PL2) may not be dummy fin patterns that do not perform a substantial function in the semiconductor device. Alternatively, the fin patterns FP_A in a layout of the semiconductor device arranged to overlap the power lines M1 (PL1) and M1 (PL2) may not be fin patterns from which all or a portion thereof is removed in the process of manufacturing the semiconductor device.

In this embodiment, no dummy fin patterns may be disposed on at least one of boundaries of the first standard cell SC1 and boundaries of the second standard cell SC2. Even in other embodiments included in this specification, no dummy fin patterns may be disposed at boundaries of standard cells.

Figure 5A:
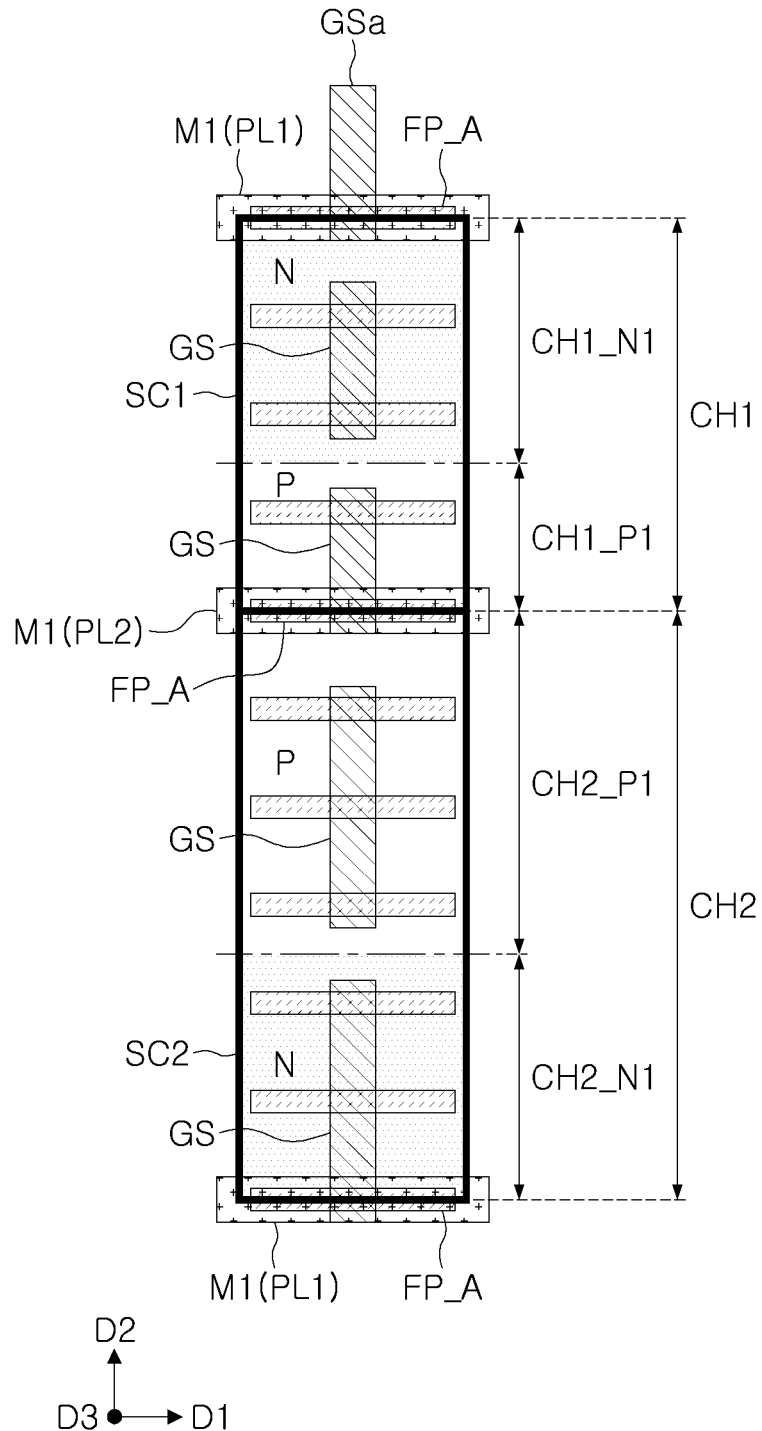
FIGS. 5A and 5B are plan views schematically illustrating semiconductor devices according to embodiments.
Figure 5B:
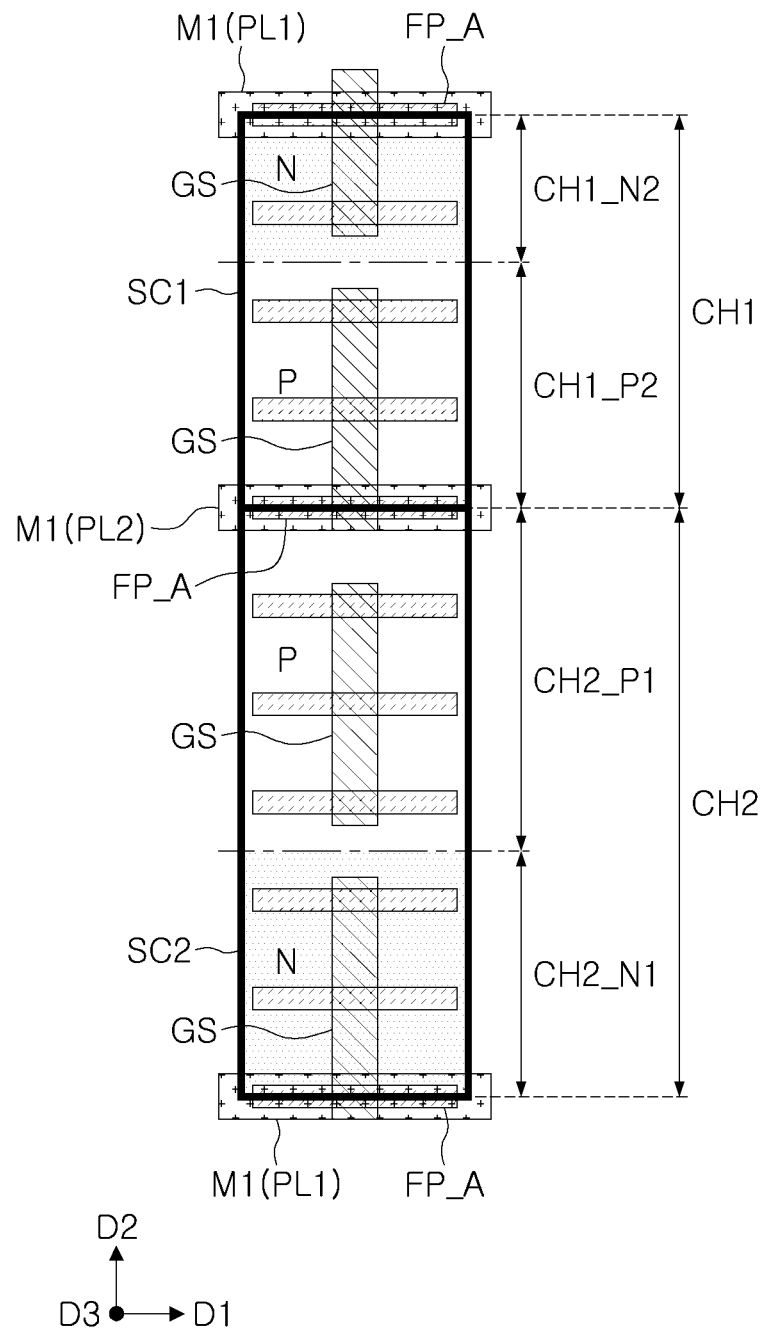

FIGS. 5A and 5B are plan views schematically illustrating semiconductor devices according to example embodiments. FIGS. 5A and 5B illustrate an arrangement relationship of an N-type device region, a P-type device region, fin patterns, a gate structure, and power lines in first and second standard cells SC1 and SC2.

Referring to FIGS. 5A and 5B, first and second standard cells SC1 and SC2 may be arranged in adjacent rows, and may have a first cell height CH1 and a second cell height CH2, different from each other. In the second standard cell SC2, a height CH2_P1 of a second P-type device region may be different from a height CH2_N1 of a second N-type device region.

Fin patterns FP_A may extend in the first direction D1 in the first and second standard cells SC1 and SC2, and may be arranged to be spaced apart from each other in the second direction D2. Some of the fin patterns FP_A may be arranged to overlap power lines M1 (PL1) and M1 (PL2) in a vertical direction D3. Widths and/or intervals of the fin patterns FP_A in the second direction D2 may be variously changed according to embodiments. For example, the fin patterns FP_A may be arranged to have the same interval from each other, or some may be arranged to have different intervals. As a height of a P-type device region is different from a height of an N-type device region, the number of fin patterns arranged in the N-type device region and the P-type device region may be also changed.

No dummy fin patterns may be disposed in the first standard cell SC1 and the second standard cell SC2. Fin patterns arranged at upper and lower boundaries of the first standard cell SC1 and at upper and lower boundaries of the second standard cell SC2 may not be dummy fin patterns. Therefore, a larger number of fin patterns may be disposed in a P-type device region and an N-type device region in standard cells.

Gate structures GS may be disposed in the first standard cell SC1 and the second standard cell SC2 to extend in the second direction D2, respectively. Some of the gate structures GS may extend to pass through a boundary between the first standard cell SC1 and the second standard cell SC2. The gate structures GS may be arranged to be spaced apart from each other by a gate separation pattern in each of the standard cells SC1 and SC2. The gate separation pattern will be described later with reference to FIG. 14.

The power lines M1 (PL1) and M1 (PL2) may be arranged to extend along the boundary between the first and second standard cells SC1 and SC2 in the first direction D1.

In an embodiment of FIG. 5A, in the first standard cell SC1, a height CH1_P1 of a first P-type device region may be smaller than a height CH1_N1 of a first N-type device region.

In the embodiment of FIG. 5A, a fin pattern FP_A may be located at an upper boundary of the first standard cell SC1, and the fin pattern FP_A may be an active fin pattern included in an adjacent standard cell sharing the upper boundary of the first standard cell SC1. The fin pattern FP_A located at the upper boundary of the first standard cell SC1 may intersect a gate structure GSa of the adjacent standard cell, and may be used as an active fin pattern of an N-type device region of the other adjacent standard cell.

A fin pattern FP_A may be located at a lower boundary of the first standard cell SC1. No dummy fin pattern may be disposed in the first standard cell SC1. No dummy fin pattern may be disposed at a boundary of the first standard cell SC1. Fin patterns FP_A disposed at the boundary of the first standard cell SC1 may at least partially overlap the power lines M1 (PL1) and M1 (PL2) in the vertical direction D3, and, as described in FIGS. 10A to 10C below, may be active fin patterns electrically connected to power lines M1 (PL1) and M1 (PL2) to substantially perform a function in a device.

In the embodiment of FIG. 5A, since the first P-type device region of the first standard cell SC1 may use the fin pattern FP_A located at the lower boundary of the first standard cell SC1 as an active fin pattern, a problem of insufficient fin in an arrangement of standard cells in the column direction may be solved. Likewise, the first N-type device region of the second standard cell SC2 may use the fin pattern FP_A located at the lower boundary of the second standard cell SC2 as an active fin pattern. Since the fin pattern FP_A located at the lower boundary of the first standard cell SC1 may be used as the active fin pattern, it can be understood that the first P-type device region of the first standard cell SC1 passes through the boundary between the first standard cell SC1 and the second standard cells SC2 and includes a partial region of the second standard cell SC2.

In an example of FIG. 5B, in the first standard cell SC1, a height CH1_P2 of a first P-type device region may be greater than a height CH1_N2 of a first N-type device region.

Figure 10A:
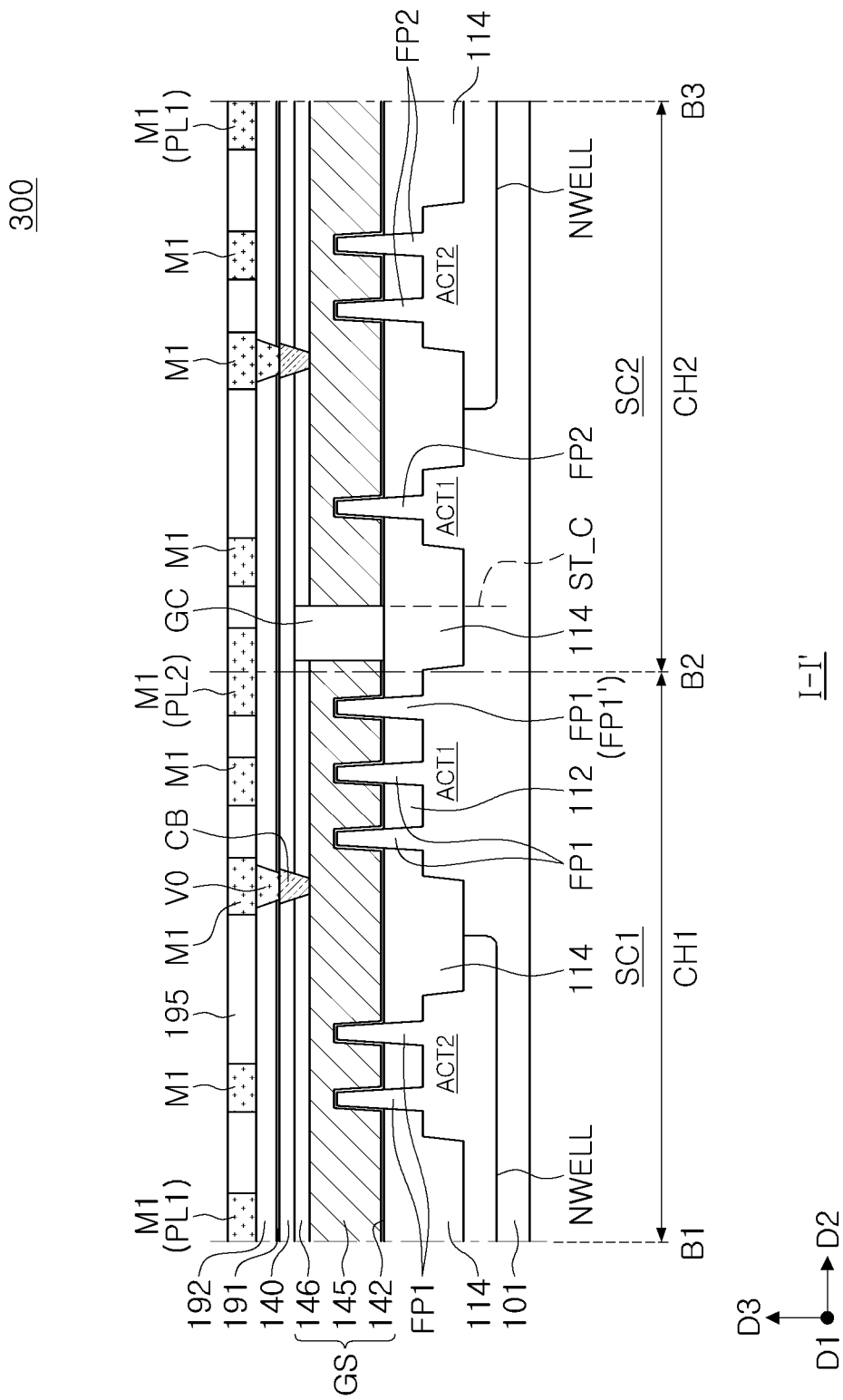
FIGS. 10A to 10C are cross-sectional views illustrating semiconductor devices according to embodiments.
Figure 10B:
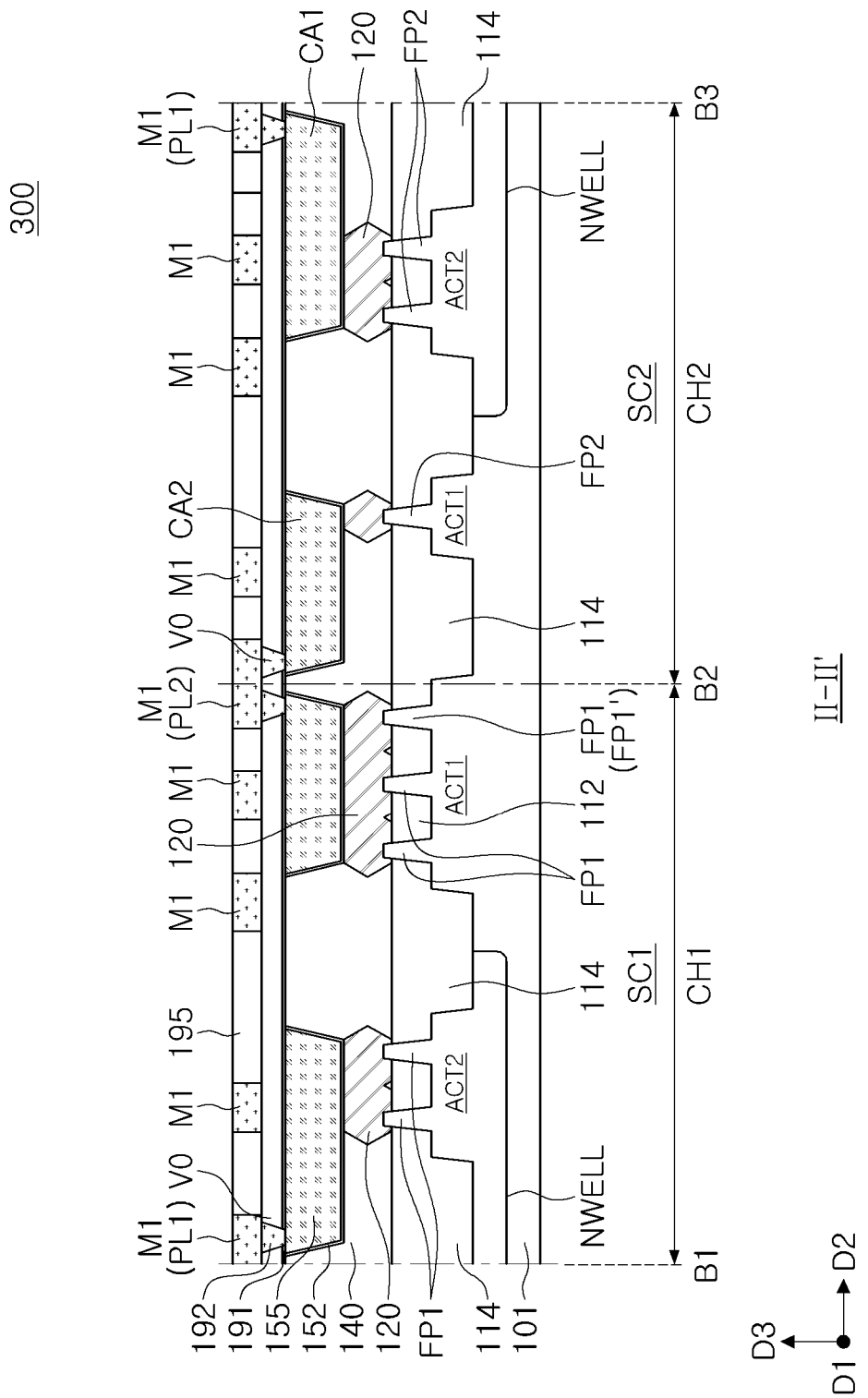
Figure 10C:
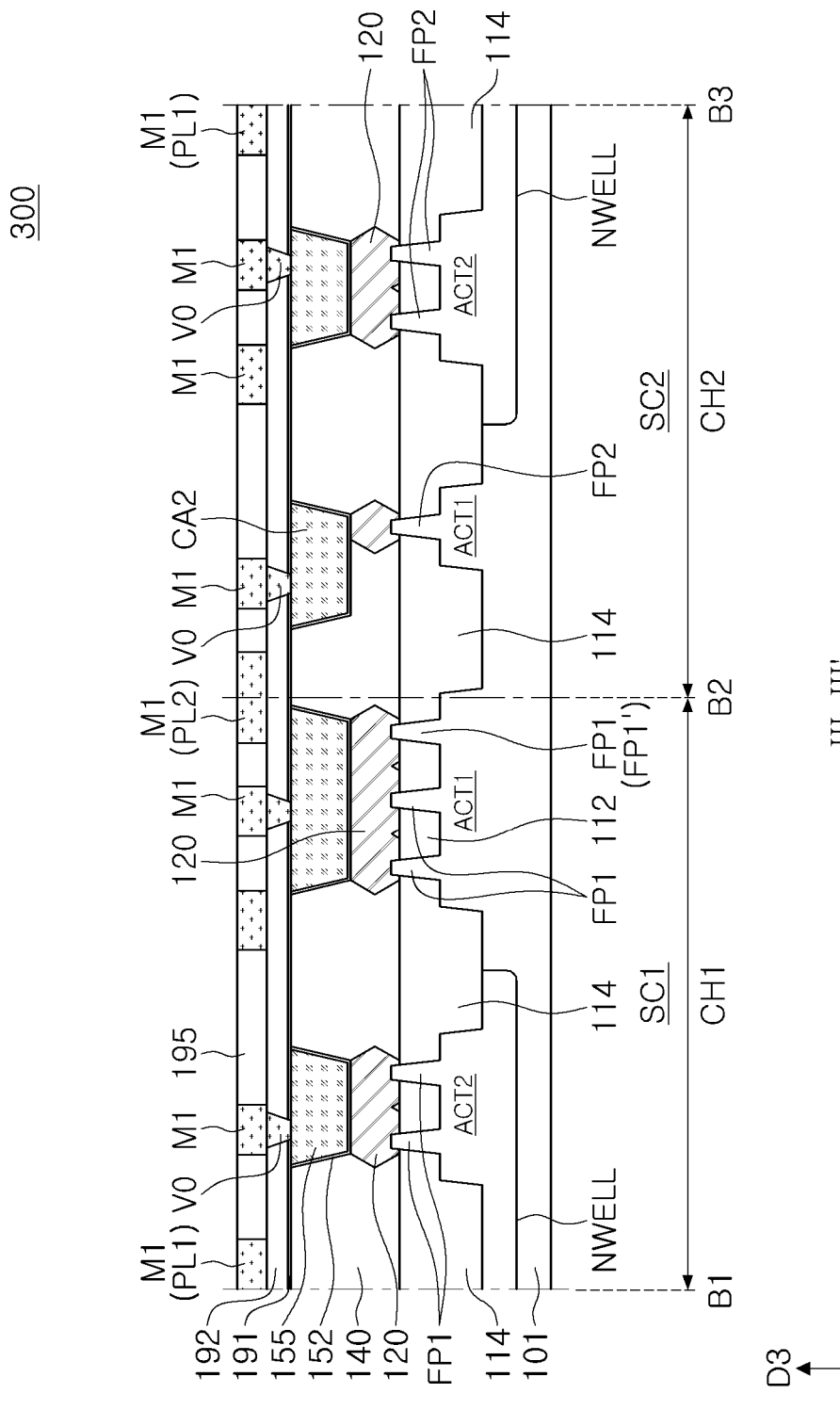

In the embodiment of FIG. 5B, fin patterns FP_A may be respectively located at upper and lower boundaries of the first standard cell SC1. The first standard cell SC1 may use all of the fin patterns FP_A located at the boundaries as active fin patterns. Fin patterns FP_A located at the boundary of the first standard cell SC1 may overlap power lines M1 (PL1) and M1 (PL2) in the vertical direction Z, and, as illustrated in FIGS. 10A to 10C below, may be electrically connected to the power lines M1 (PL1) and M1 (PL2).

Figure 6:
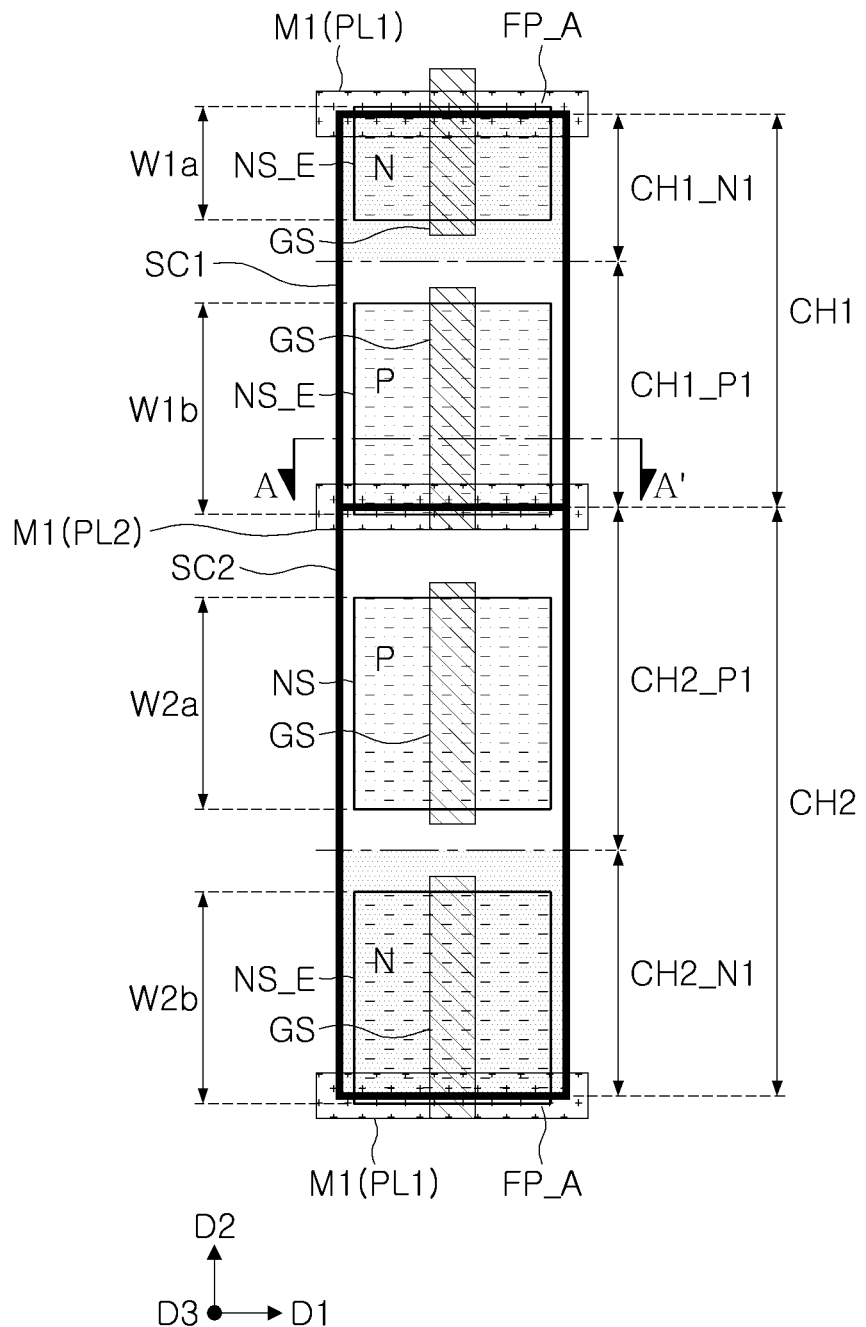
FIG. 6 is a plan view schematically illustrating a semiconductor device according to an embodiment.

FIG. 6 is a plan view schematically illustrating a semiconductor device according to example embodiments.

Referring to FIG. 6, in a semiconductor device, a plurality of channel layers NS may be arranged in a first standard cell SC1 and a second standard cell SC2. The plurality of channel layers NS may correspond to a plurality of channel layers 130 disposed on fin patterns to be spaced apart from each other in the vertical direction D3, as described below with reference to FIG. 13.

The plurality of channel layers NS may be disposed in a P-type device region and an N-type device region, respectively. Each of the plurality of channel layers NS may have a shape of a nano-sheet extending in the first direction D1 and the second direction D2.

Some of the plurality of channel layers NS may be arranged to overlap power lines M1 (PL1) and M1 (PL2) in the vertical direction. The plurality of channel layers NS may include extended channel layers NS_E disposed to extend beyond boundaries of the standard cells SC1 and SC2. For example, some of the extended channel layers NS_E may be disposed at a boundary between the first standard cell SC1 and the second standard cell SC2.

Widths and/or intervals of the plurality of channel layers NS in the second direction D2 may be variously changed according to example embodiments. As heights of the P-type device region and the N-type device region of each of the standard cells may be different, the widths of the plurality of channel layers NS disposed in the P-type device region and the N-type device region in the second direction D2 may be different. For example, in the first standard cell SC1, a height CH1_P1 of the P-type device region may be greater than a height CH1_N1 of the N-type device region, and a width W1b of a first extended channel layer NS_E disposed in the P-type device region in the second direction D2 may be greater than a width W1a of a second extended channel layer NS_E disposed in the N-type device region in the second direction D2. Similarly, widths W2a and W2b of the channel layers NS and NS_E disposed in the second standard cell SC2 in the second direction D2 may be different from each other.

Each of the gate structures GS may be disposed in the first standard cell SC1 and the second standard cell SC2 to extend in the second direction D2. Some of the gate structures GS may extend to pass through the boundary between the first standard cell SC1 and the second standard cell SC2. The gate structures GS may also be disposed between a plurality of channel layers NS, spaced apart from each other in the vertical third direction D3, as described in FIG. 13 below.

Since the plurality of extended channel layers NS_E may be disposed to extend to pass through upper and lower boundaries of the first standard cell SC1, as disposed in the first standard cell SC1 of FIG. 6, a problem of insufficient width of the nano-sheet-shaped channel layers in an arrangement of standard cells in the column direction may be solved.

In another example, when a vertical field effect transistor (vertical FET) may be disposed in at least one region of the semiconductor device, a height of the P-type device region and a height of the N-type device region in the standard cells SC1 and SC2 may be divided in the second direction D2 by a length of a fin pattern extending in the second direction D2.

Figure 7:
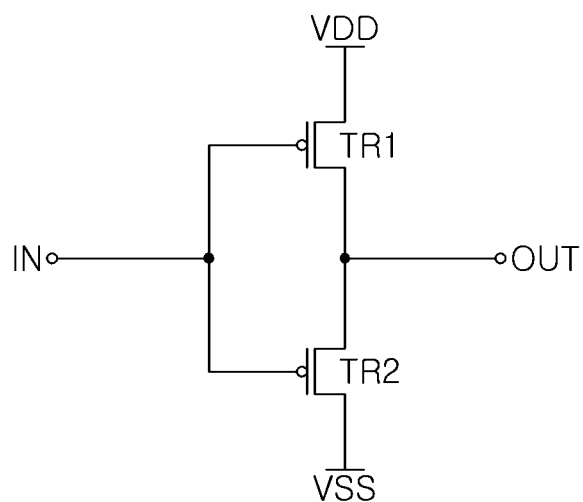
FIG. 7 is a circuit diagram of a unit circuit provided by a standard cell included in a semiconductor device according to an embodiment.
Figure 8A:
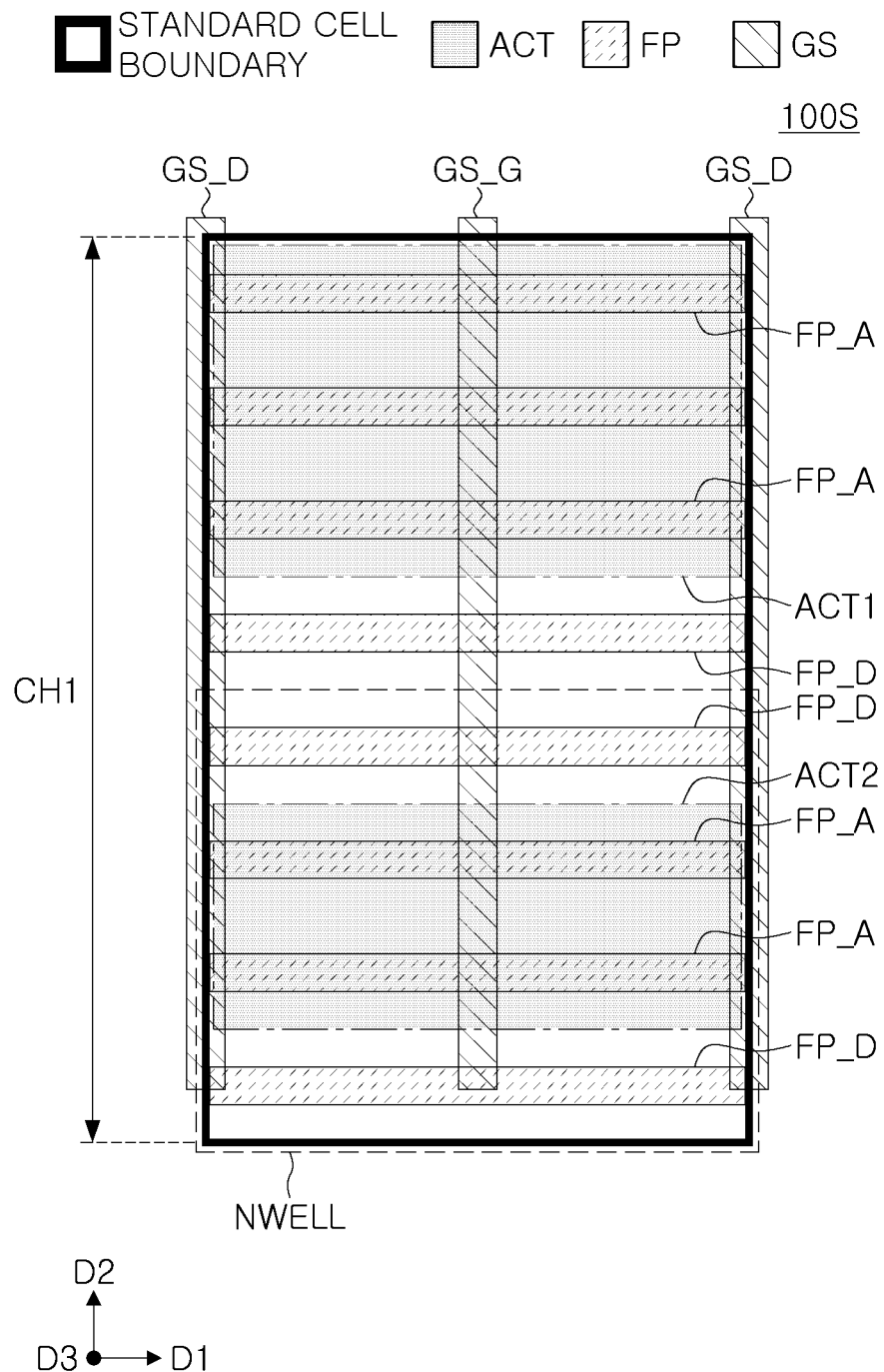
FIGS. 8A and 8B are layout diagrams illustrating a standard cell corresponding to a unit circuit according to embodiments.
Figure 8B:
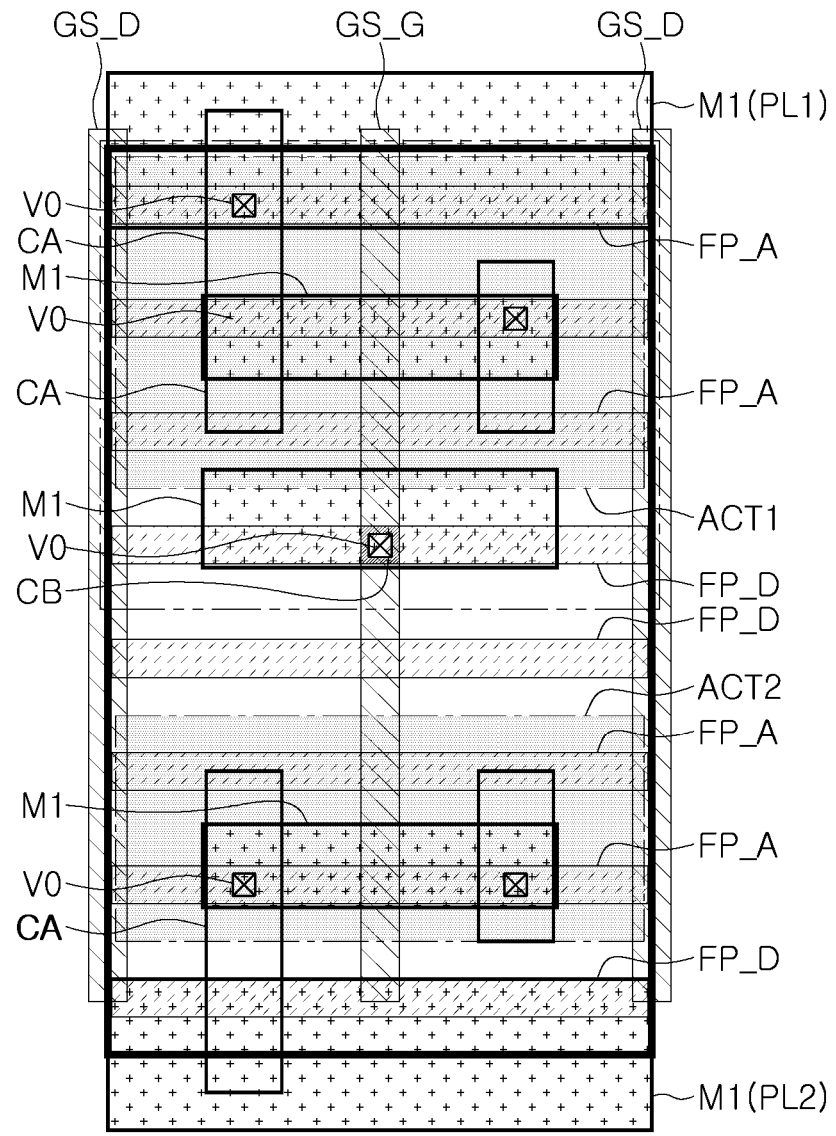

FIG. 7 is a circuit diagrams of a unit circuit provided by a standard cell included in a semiconductor device according to example embodiments. FIGS. 8A and 8B are layout diagrams illustrating a standard cell corresponding to the unit circuit, respectively. FIG. 8B is a plan view additionally illustrating a contact structure CA, a gate contact structure CB, a conductive via V0, and wiring lines M1 including power lines PL1 and PL2 in the plan view of FIG. 8A.

Referring to FIG. 7, a unit circuit may be an inverter circuit. The inverter circuit may include a pull-up element TR1 receiving first power VDD and a pull-down element TR2 receiving second power VSS. Gates of the pull-up element TR1 and the pull-down element TR2 may be connected to each other to provide an input terminal IN. One of source/drain regions of the pull-up element TR1 and one of source/drain regions of the pull-down element TR2 may be connected to each other to provide an output terminal OUT. Such an inverter circuit may be only one example of unit circuits that may be provided by a standard cell. Standard cells may provide various circuits such as NAND standard cells, NOR standard cells, or the like, in addition to the inverter circuit.

Referring to FIGS. 8A and 8B, a standard cell 100S may include base active regions ACT1 and ACT2, fin patterns FP_A disposed on the base active regions ACT1 and ACT2 and extending in the first direction D1, gate structures GS_G and GS_D extending in the second direction D2, a contact structure CA connected to the fin patterns FP_A, a gate contact structure CB connected to the gate structures GS, conductive vias V0 respectively connected to the contact structure CA and the gate contact structure CB, and first wiring lines M1 connected to the conductive vias V0.

The base active regions ACT1 and ACT2 may be disposed in WELL regions of different conductivity types. For example, a first base active region ACT1 may be a P-type active region, and a second base active region ACT2 may be an N-type active region. In order to provide the inverter circuit of FIG. 7, the contact structure CA connected to one of the P-type active region and the N-type active may be connected to the first power line PL1 among the first wiring lines M1 through the conductive via V0, and the contact structure CA connected to the other thereof may be connected to the second power line PL2 among the first wiring lines M1 through the conductive via V0.

Fin patterns not disposed on the base active regions ACT1 and ACT2 may be dummy fin patterns FP_D. Although the dummy fin patterns FP_D are illustrated on the layout of the standard cell 100S, in an actual semiconductor device, all or a portion of the dummy fin patterns FP_D may be removed. The dummy fin patterns FP_D may not perform a practical function in a semiconductor device. Dummy fin patterns may not be disposed at a boundary of the standard cell 100S.

The gate structures GS may include a gate GS_G and a dummy gate GS_D. The gate GS_G may intersect the fin patterns FP_A on the base active regions ACT1 and ACT2. The gate GS_G may provide a pull-up element TR1 and a pull-down element TR2 of an inverter circuit, together with the base active regions ACT1 and ACT2. In the inverter circuit of FIG. 7, since gates of the pull-up element TR1 and the pull-down element TR2 are connected to each other, the gate GS_G may be shared between the pair of base active regions ACT1 and ACT2. The gate GS_G may be connected to a signal transmission line among the first wiring lines M1 through the gate contact structure CB. The dummy gate GS_D may be disposed on both ends of a single standard cell 100S in the first direction D1.

The first wiring lines M1 may be wirings disposed on or above the base active regions ACT1 and ACT2 and the gate structure GS_G in the third direction D3, and may extend in the first direction D1. The first wiring lines M1 may include a first power line PL1, a second power line PL2, and a signal transmission line. The first power line PL1 and the second power line PL2 may be power transmission lines respectively supplying different power voltages VDD and VSS in the semiconductor device, and may be electrically connected to source/drain regions on the base active regions ACT1 and ACT2. The signal transmission lines may be signal transmission lines that supply signals to the semiconductor device, and may be electrically connected to the gate GS_G. The first power line PL1 and the second power line PL2 may be disposed over the boundary of the standard cell 100S, such that, for example, only half of a region thereof is located in the standard cell 100S.

Figure 9A:
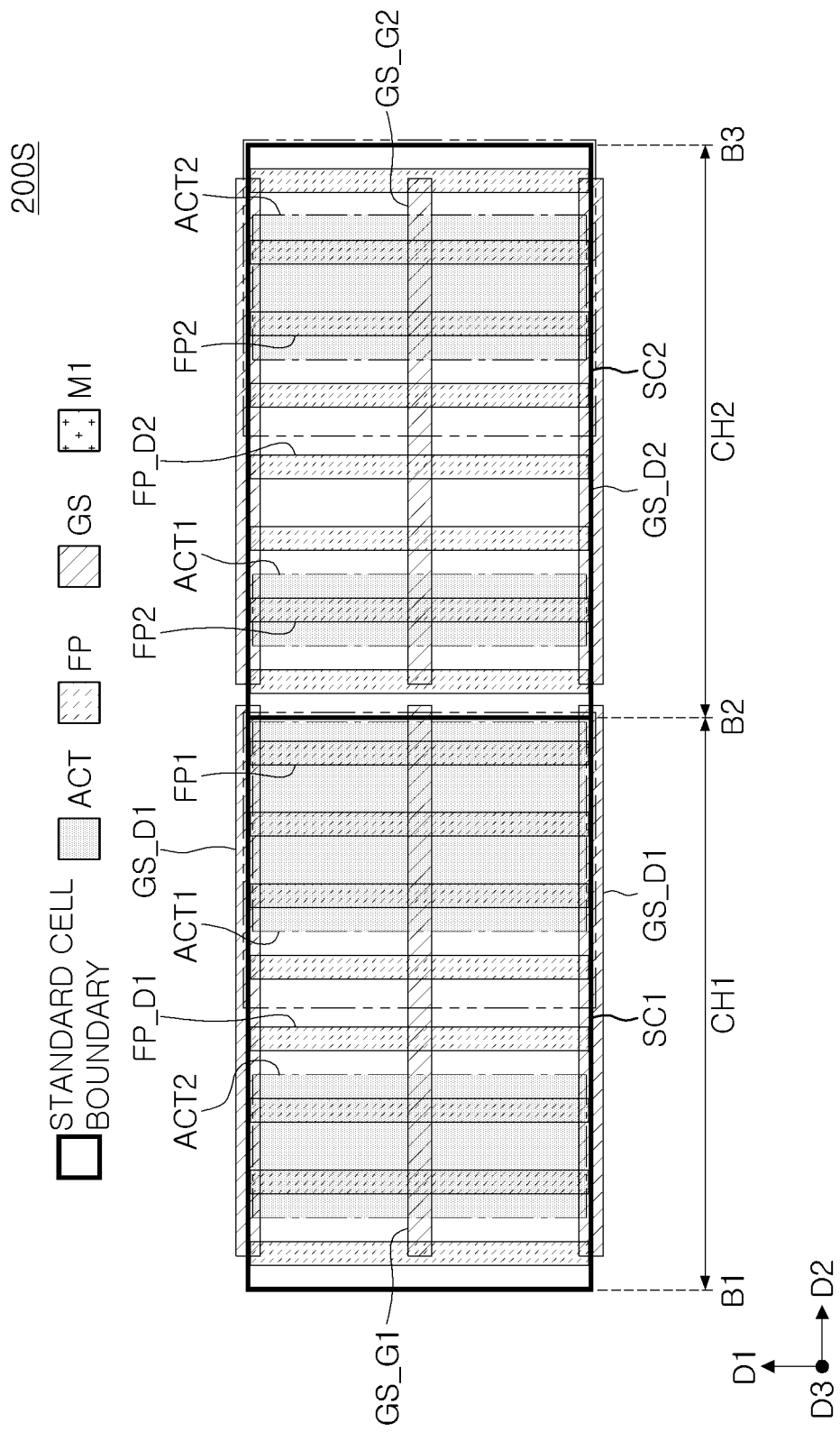
FIGS. 9A and 9B are layout diagrams illustrating standard cells included in semiconductor devices according to embodiments.
Figure 9B:
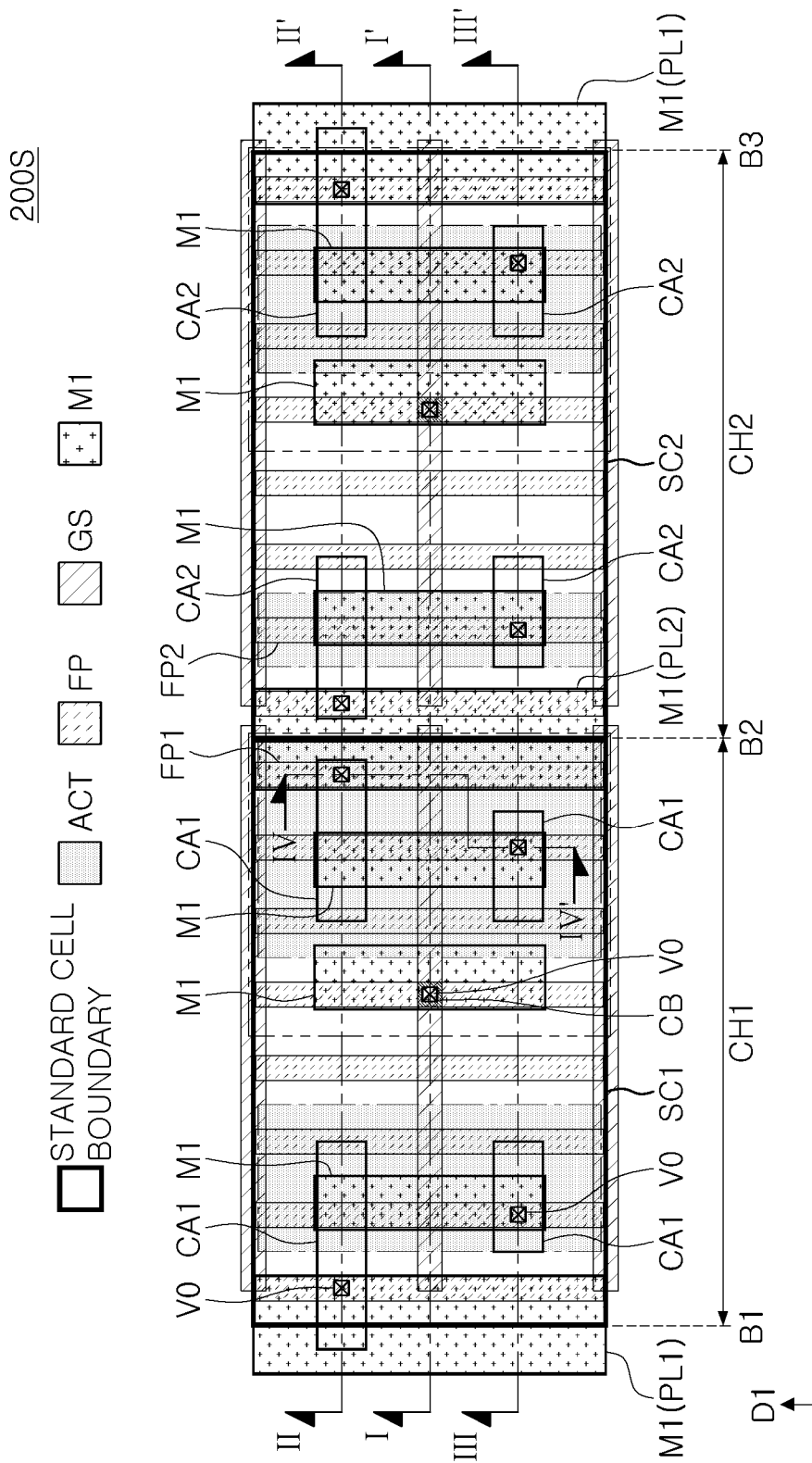

FIGS. 9A and 9B are layout diagrams illustrating standard cells included in semiconductor devices according to example embodiments. FIGS. 10A to 10C are cross-sectional views illustrating semiconductor devices according to example embodiments.

Referring to FIGS. 9A and 9B, standard cells 200S of a semiconductor device may include a first standard cell SC1 and a second standard cell SC2, arranged in rows adjacent to each other. The first standard cell SC1 and the second standard cell SC2 illustrate that standard cells implementing the inverter circuit of FIG. 8B may be disposed adjacent to each other. For example, the first standard cell SC1 of FIG. 9B may have the same layout as the standard cell 100S of FIG. 8B, and the second standard cell SC2 of FIG. 9B may have different layouts from the standard cell 100S of FIG. 8B, only in view of arrangements of base active regions ACT1 and ACT2. The first standard cell SC1 and the second standard cell SC2 may share one power line disposed along a boundary B2. The first standard cell SC1 may have a first cell height CH1, and the second standard cell SC2 may have a second cell height CH2. In example embodiments, the first cell height CH1 may be different from the second cell height CH2. In example embodiments, the first cell height CH1 may be identical to the second cell height CH2.

FIGS. 10A to 10C illustrate cross-sectional views of the semiconductor device of FIG. 9B taken along lines I-I', II-II', and III-III', respectively.

Referring to FIGS. 10A to 10C, a semiconductor device 300 may include a substrate 101, base active regions ACT1 and ACT2, fin patterns FP1 and FP2, device isolation layers 112 and 114, source/drain regions 120, gate structures GS, lower interlayer insulating layer 140, a contact structure CA, a gate contact structure CB, upper interlayer insulating layers 192 and 195, a conductive via V0, and first wiring lines M1. The semiconductor device 300 may further include an etch stop layer 191 disposed on a lower surface of the upper interlayer insulating layer 192, and barrier layers disposed along lower surfaces of the wiring lines M1 and a lower surface of the conductive via V0. The semiconductor device 300 may include FinFET elements in which fin patterns FP on the base active regions ACT1 and ACT2 have a fin structure.

The substrate 101 may have an upper surface extending in the first direction D1 and the second direction D2. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The base active regions ACT1 and ACT2 may be defined by (i.e., surrounded by) the device isolation layers 112 and 114 in the substrate 101, and may be disposed to extend in the first direction D1. Fin patterns FP1 and FP2 may have a shape protruding from the base active regions ACT1 and ACT2 in the third direction D3. Upper ends of the fin patterns FP1 and FP2 may be disposed to protrude from upper surfaces of the device isolation layers 112 and 114 to a predetermined height level. The base active regions ACT1 and ACT2 may be formed as a portion of the substrate 101 or may include an epitaxial layer grown from the substrate 101. The fin patterns FP1 and FP2 may be partially recessed on both sides of gate structures GS_G1 and GS_G2, and the source/drain regions 120 may be disposed on the recessed fin patterns FP1 and FP2. The fin patterns FP1 and FP2 may have doped regions including impurities. For example, the fin patterns FP1 and FP2 may include impurities diffused from the source/drain regions 120 in a region contacting the source/drain regions 120.

The base active regions ACT1 and ACT2 may include a first base active region ACT1 and a second base active region ACT2. Each of the first standard cell SC1 and the second standard cell SC2 may include the first base active region ACT1 and the second base active region ACT2. The first base active region ACT1 and the second base active region ACT2 may be active regions of different conductivity types. For example, the second base active region ACT2 may be a region having an NWELL.

In the first standard cell SC1, the first fin patterns FP1 may be disposed on the first and second base active regions ACT1 and ACT2. In the second standard cell SC2, the second fin patterns FP2 may be disposed on the first and second base active regions ACT1 and ACT2.

The first fin patterns FP1 may include a first external fin pattern FP1' overlapping at least one of power lines M1 (PL1) and M1 (PL2) in the vertical direction D3. For example, as shown in FIG. 10A, the first external fin pattern FP1' may be disposed below power line M1 (PL2) in the vertical direction (i.e., the third direction D3). The first external fin pattern FP1' may be disposed to be adjacent to an external region of the first standard cell SC1. For example, the first external fin pattern FP1' may be disposed adjacent to a boundary B2 between the first standard cell SC1 and the second standard cell SC2. The first external fin pattern FP1' may be offset from the boundary B2 in the second direction D2. According to embodiments, the first external fin pattern FP1' may be disposed at the boundary B2.

The first external fin pattern FP1' may intersect the gate structure GS. As illustrated in FIG. 10B, source/drain regions 120 may be disposed on the first external fin pattern FP1' on both sides of the gate structure GS, and may be electrically connected to at least one of the power lines M1 (PL1) and M1 (PL2) through a first contact structure CA1 and the conductive via V0. The first external fin pattern FP1' may be an active fin pattern that substantially performs a function in the semiconductor device 300. A fin pattern disposed below the power line M1 (PL2) may not be a dummy pattern.

The device isolation layers 112 and 114 may include a shallow device isolation layer 112 and a deep device isolation layer 114. The shallow device isolation layer 112 may be disposed between the fin patterns FP1 and FP2 such that the fin patterns FP1 and FP2 protrude in an upward direction. The deep device isolation layer 114 may surround an outside of the shallow device isolation layer 112. The device isolation layers 112 and 114 may be formed of an insulating material, and may include, for example, an oxide, a nitride, or a combination thereof.

The device isolation layers 112 and 114 may be disposed between the first base active region ACT1 and the second base active region ACT2. The device isolation layers 112 and 114 may be disposed between the first base active region ACT1 of the first standard cell SC1 and the first base active region ACT1 of the second standard cell SC2. The first base active region ACT1 of the first standard cell SC1 and the first base active region ACT1 of the second standard cell SC2 may have the same conductivity type (e.g., p-type as shown in FIG. 10A). The device isolation layers 112 and 114 disposed between the first base active region ACT1 of the first standard cell SC1 and the first base active region ACT1 of the second standard cell SC2 may have a central line ST_C extending in the first direction D1 as shown in FIG.

11. The central line ST_C of the device isolation layers 112 and 114 may be offset from or shifted with respect to a central line of the power line M1 (PL2) in the second direction D2. The central line ST_C of the device isolation layers 112 and 114 may not be aligned with the central line of the power line M1 (PL2) when viewed in the first direction D1. The central line of the power line M1 (PL2) in the first direction D1 may be aligned with the boundary B2 between the first standard cell SC1 and the second standard cell SC2. The central line ST_C of the device isolation layers 112 and 114 may be offset or shifted from the boundary B2 in the second direction D2.

The source/drain regions 120 may be disposed on both sides of the gate structures GS_G1 and GS_G2 in the first direction D1 on recess regions in which the fin patterns FP1 and FP2 are recessed. The source/drain regions 120 may be provided as source regions or drain regions of transistors. Upper surfaces of the source/drain regions 120 may be located on a height level that may be the same as or similar to lower surfaces of the gate structures GS_G1 and GS_G2 in a cross-sectional view in the first direction D1. Relative height levels of the source/drain regions 120 and the gate structures GS_G1 and GS_G2 may be variously changed according to embodiments.

The source/drain regions 120 may have a merged shape connected to each other between the fin patterns FP1 and FP2 that are adjacent in the second direction D2, as illustrated in FIG. 10B, but is not limited thereto. The source/drain regions 120 may have an angular lateral surface in a cross-sectional view in the second direction D2 when viewed in the first direction D1. In embodiments, the source/drain regions 120 may have various shapes, and, for example, may have any one of polygonal, circular, elliptical, and rectangular shapes.

The source/drain regions 120 may be formed of an epitaxial layer, and may include, for example, silicon (Si), silicon germanium (SiGe), or silicon carbide (SiC). Also, the source/drain regions 120 may further include impurities such as arsenic (As) and/or phosphorus (P). In example embodiments, the source/drain regions 120 may include a plurality of regions including elements of different concentrations and/or doping elements.

The gate structures GS_G1 and GS_G2 may be disposed on the base active regions ACT1 and ACT2 by intersecting the base active regions ACT1 and ACT2 to extend in the second direction D2. The gate structures GS_G1 and GS_G2 may intersect the fin patterns FP1 and FP2. Channel regions of transistors may be formed in the fin patterns FP1 and FP2 intersecting the gate structures GS_G1 and GS_G2. The gate structures GS_G1 and GS_G2 may include a gate insulating layer 142, a gate electrode layer 145, a gate capping layer 146, and gate spacer layers 144 (refer to FIG. 13), respectively.

The gate insulating layer 142 may be disposed between the fin patterns (FP1 and FP2) and the gate electrode layer 145. The gate insulating layer 142 may be formed of a plurality of layers, or may be disposed to extend onto a lateral surface of the gate electrode layer 145. The gate insulating layer 142 may include an oxide, a nitride, or a high-k material. The high-k material may refer to a dielectric material having a dielectric constant, higher than a dielectric constant of a silicon oxide layer ($SiO_2$).

The gate electrode layer 145 may include a conductive material, and may include, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like, or a semiconductor material such as doped polysilicon. The gate electrode layer 145 may be formed of two or more multiple layers. The gate electrode layer 145 may be disposed to be separated from each other in the first direction D1 between at least some adjacent transistors, according to a configuration of the semiconductor device 300.

The gate capping layer 146 may be disposed on the gate electrode layer 145, and lower and lateral surfaces thereof may be surrounded by the gate electrode layer 145 and the gate spacer layers 144, respectively. The gate capping layer 146 may be formed of, for example, an oxide, a nitride, and an oxynitride.

The lower interlayer insulating layer 140 may be disposed to cover the source/drain regions 120 and the gate structures GS_G1 and GS_G2. The lower interlayer insulating layer 140 may include, for example, at least one of an oxide, a nitride, and an oxynitride, and may include a low-k material.

Contact structures CA1 and CA2 may pass through the lower interlayer insulating layer 140 as shown in FIG. 10B to be connected to the source/drain regions 120, and may apply an electrical signal to the source/drain regions 120. The contact structures CA1 and CA2 may be disposed to recess the source/drain regions 120 to a predetermined depth, but are not limited thereto. The contact structures CA1 and CA2 may include a conductive material, for example, a metal material such as tungsten (W), aluminum (Al), copper (Cu), or a semiconductor material such as doped polysilicon. According to embodiments, the contact structures CA1 and CA2 may include a barrier metal layer disposed along an outer surface. In addition, according to embodiments, the contact structures CA1 and CA2 may further include a metal-semiconductor layer such as a silicide layer, disposed on an interface contacting the source/drain regions 120.

The gate contact structures CB may pass through the lower interlayer insulating layer 140 and the gate capping layer 146 as shown in FIG. 10A to be connected to the gate electrode layer 145. The gate contact structures CB may be disposed to recess the gate electrode layer 145 to a predetermined depth, but is not limited thereto. The gate contact structures CB may include a conductive material, for example, a metal material such as tungsten (W), aluminum (Al), copper (Cu), or a semiconductor material such as doped polysilicon. According to embodiments, the gate contact structures CB may include a barrier metal layer disposed along an outer surface.

The upper interlayer insulating layers 192 and 195 may cover the contact structures CA1 and CA2, and may be disposed on the same level as a wiring structure including the conductive vias V0 and the first wiring lines M1. The upper interlayer insulating layers 192 and 195 may include a first upper insulating layer 192 and a second upper insulating layer 195. The first upper insulating layer 192 may be disposed on the same height level as the conductive vias V0, and the second upper insulating layer 195 may be disposed on the same height level as the first wiring lines M1. The upper interlayer insulating layers 192 and 195 may be formed of silicon oxide or a low-k material. The upper interlayer insulating layers 192 and 195 may include, for example, at least one of SiO, SiN, SiCN, SiOC, SiON, and SiOCN.

The etch stop layer 191 may be disposed on the lower surface of the first upper interlayer insulating layer 192. The etch stop layer 191 may function as an etch stop layer in an etching process for forming the conductive vias V0. The etch stop layer 191 is illustrated to be disposed along the lower surface of the first upper interlayer insulating layer 192, but may also be disposed along a lower surface of the second upper interlayer insulating layer 195. The etch stop layer 191 may include a high-k material, and may include, for example, silicon nitride or aluminum oxide.

The first wiring lines M1 may be connected to the gate structures GS_G1 and GS_G2 and the contact structures CA through conductive vias V0, respectively. Each of the first wiring lines M1 and the conductive vias V0 may include a conductive material. For example, each of the first wiring lines M1 and the conductive vias V0 may include at least one of aluminum (Al), copper (Cu), and tungsten (W).

Barrier layers may be disposed along lower surfaces of the first wiring lines M1 and the conductive vias V0. An arrangement of the barrier layers may be changed, as the conductive vias V0 and the first wiring lines M1 are formed to have a single damascene structure or a dual damascene structure, respectively. For example, when the single damascene structure is used, the barrier layer may cover lower and lateral surfaces of the conductive vias V0, and may cover lower and lateral surfaces of the first wiring lines M1. For example, when the dual damascene structure is used, the barrier layer may continuously extend from the lower and lateral surfaces of the first wiring lines M1 to the lower surfaces of the conductive vias V0 along the lateral surfaces of the conductive vias V0, and the conductive via V0 and the first wiring line M1 may be formed to have a continuous structure. The barrier layer may include at least one of titanium (Ti), tantalum (Ta), cobalt (Co), titanium nitride (TiN), and tantalum nitride (TaN).

Figure 11:
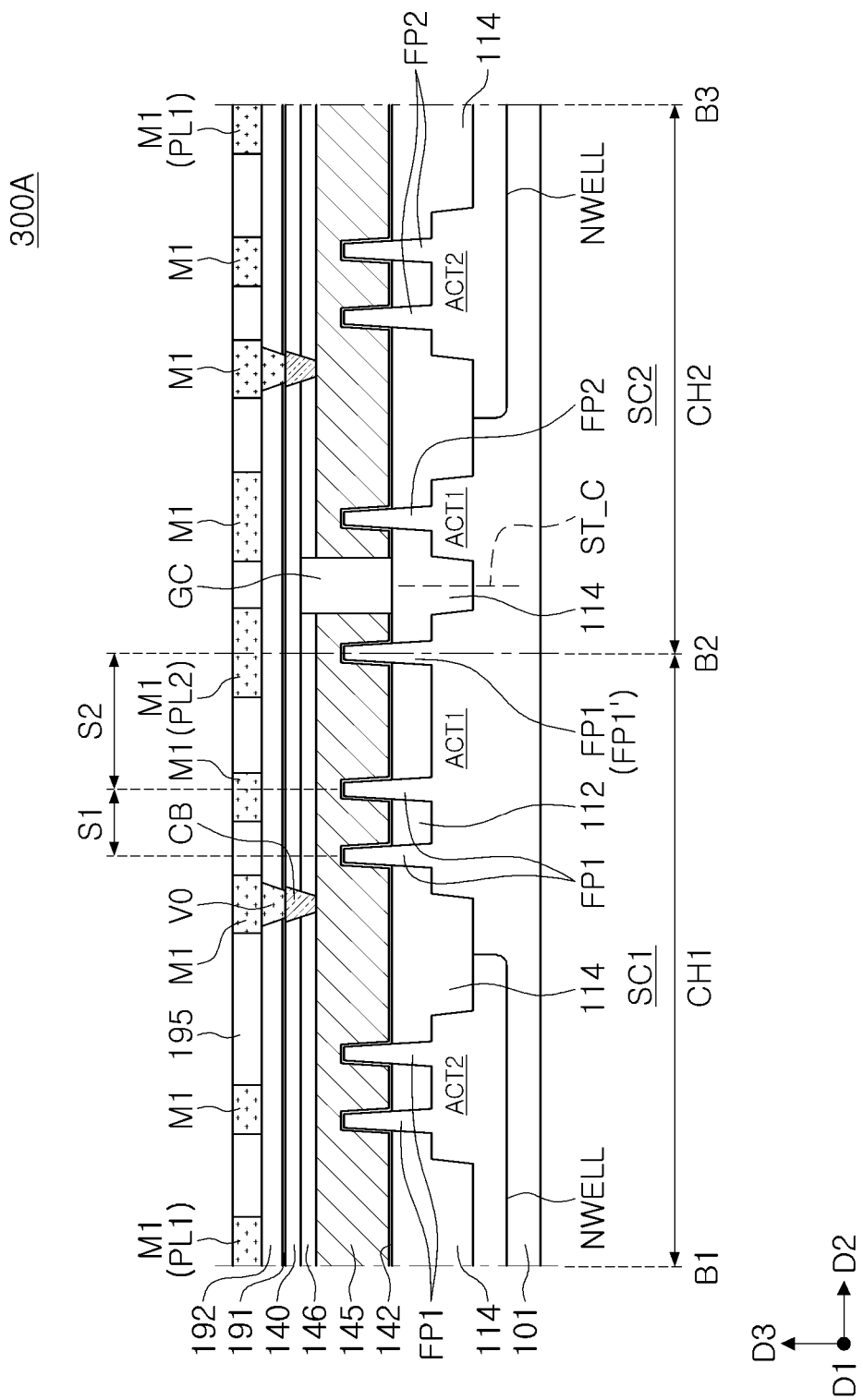
FIG. 11 is a cross-sectional view illustrating a semiconductor device according to an embodiment.

FIG. 11 is a cross-sectional view illustrating a semiconductor device according to example embodiments. FIG. 11 illustrates a region corresponding to FIG. 10A.

Referring to FIG. 11, in a semiconductor device 300A, a first external fin pattern FP1' overlapping a power line M1 (PL2) in the vertical direction D3 may be disposed at a boundary B2 between a first standard cell SC1 and a second standard cell SC2. The first external fin pattern FP1' may be aligned with a central line of the power line M1 (PL2). The central line of the first external fin pattern FP1' in the first direction D1 may be aligned with the boundary B2.

First fin patterns FP1 may include first internal fin patterns FP1 disposed at a first interval S1. The first external fin pattern FP1' may be disposed to be spaced apart from the first internal fin pattern FP1, adjacent to the first external fin pattern FP1', at a second interval S2. The first interval S1 may be different from the second interval S2. For example, the second interval S2 may be larger than the first interval S1. In another example, a first internal fin pattern FP1 may be further disposed therebetween such that the second interval S2 is less than the first interval S1.

Figure 12:
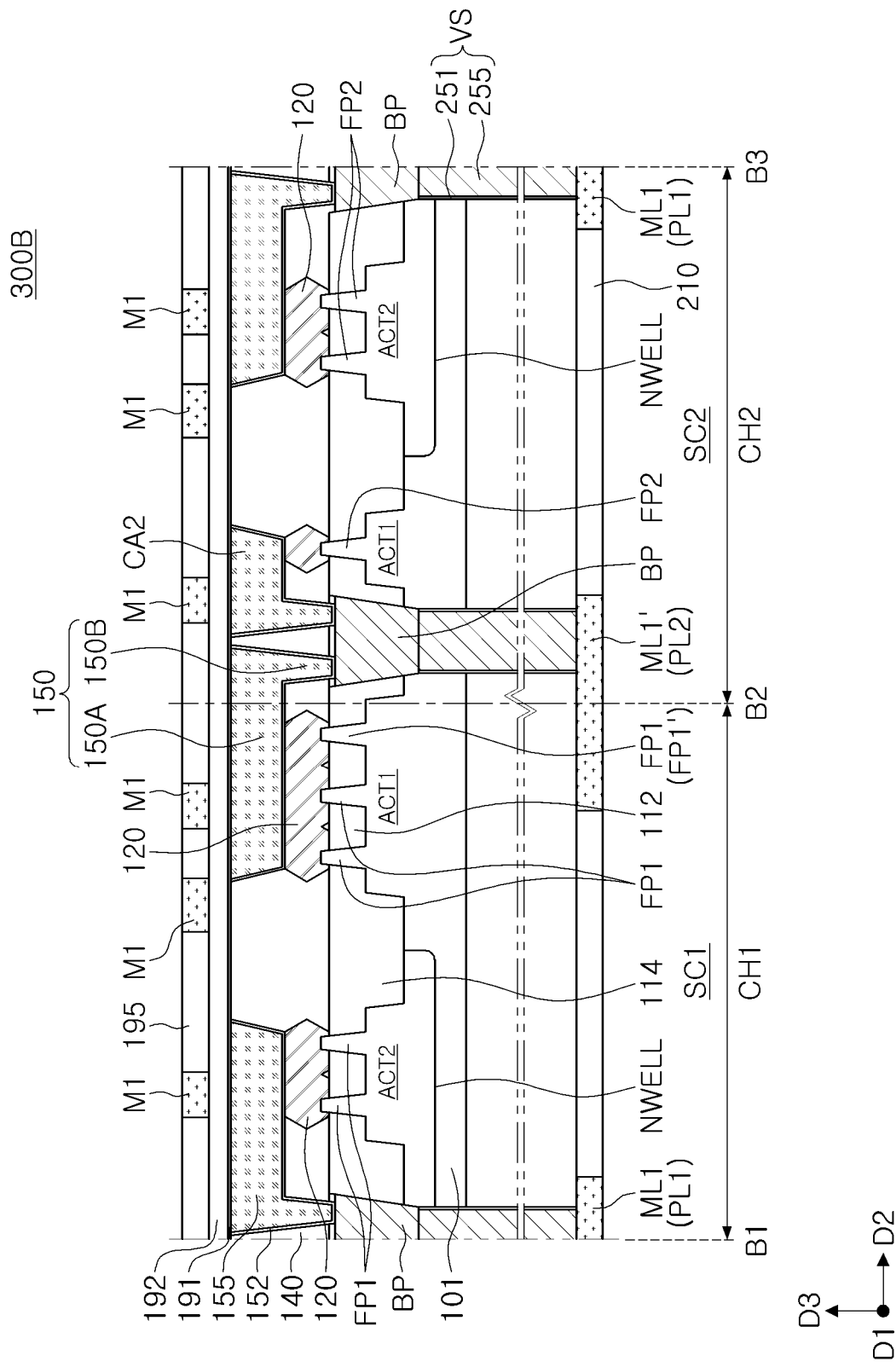
FIG. 12 is a cross-sectional view illustrating a semiconductor device according to an embodiment.

FIG. 12 is a cross-sectional view illustrating a semiconductor device according to example embodiments.

Referring to FIG. 12, it can be understood that a semiconductor device 300B is similar to the semiconductor device 300 illustrated in FIGS. 10A to 10C, except that a power line is implemented as a buried power line BP and arrangements of first wiring lines M1 are different. Further, components of this embodiment can be understood with reference to descriptions of the same or similar components of the semiconductor device 300 illustrated in FIGS. 10A to 10C, unless otherwise specified.

The semiconductor device 300B may include a buried power line BP extending along boundaries B1, B2, and B3 of standard cells SC1 and SC2 in the first direction D1 and buried between base active regions ACT1 and ACT2 and between device isolation layers 112 and 114, a through structure VS connected to the buried power line BP, and a first wiring portion ML1 connected to the through structure VS. While the power lines described in above-described embodiments may be disposed on a height level, higher than upper surfaces of contact structures CA, the buried power line BP of this embodiment may be disposed on a height level, lower than the upper surfaces of the contact structures CA. The buried power line BP may not be located in a back-end-of-line (BEOL) structure of the semiconductor device, in a similar manner to the first wiring lines M1. Therefore, wiring lines located on the same height level may be more freely designed, and a standard cell having a number of tracks (the number of wiring lines, or the like) may be implemented with a relatively lower cell height, or a larger number of tracks may be guaranteed in a standard cell having the same cell height.

The device isolation layers 112 and 114 of the semiconductor device 300B may include a shallow device isolation layer 112 defining fin patterns FP1 and FP2 and a deep device isolation layer 114 defining the base active regions ACT1 and ACT2. The deep device isolation layer 114 may have a bottom surface, deeper than a bottom surface of the shallow device isolation layer 112. The deep device isolation layer 114 may be referred to as deep trench isolation (DTI) having a first depth, and the shallow device isolation layer 112 may be referred to as shallow trench isolation (STI) having a second depth, smaller than the first depth. The fin patterns FP1 and FP2 may pass through the shallow device isolation layer 112, and may partially protrude above the shallow device isolation layer 112.

The buried power line BP may be disposed to extend from the shallow device isolation layer 112 to be deeper than the bottom surface of the deep device isolation layer 114, to have a bottom surface buried in a substrate 101. The bottom surface of the buried power line BP may be located on a height level, lower than a height level of the device isolation layers 112 and 114. The buried power line BP may extend in the first direction D1. The buried power line BP may have an upper surface, lower than upper ends of the fin patterns FP1 and FP2. The buried power line BP may not be externally exposed during a process of forming source/drain regions 120.

The buried power line BP may be electrically connected to contact structures CA1. In this embodiment, the contact structure CA1 may connect the source/drain regions 120 and the buried power line BP together. The contact structure CA1 may include a conductive barrier 152 and a contact plug 155. The contact structure CA1 may include a first contact portion 150A connected to the source/drain regions 120 and a second contact portion 150B connected to the buried power line BP. The first contact portion 150A and the second contact portion 150B may be connected. The second contact portion 150B may extend to be deeper than the first contact portion 150A, and may be electrically connected to the buried power line BP. The second contact portion 150B may be referred to as an 'extension portion'. The first contact portion 150A may extend to cross the boundary B2 between the first standard cell SC1 and the second standard cell SC2 in the second direction D2, such that a portion of the first contact portion 150A is located in the second standard cell SC2. The contact structure CA1 may be connected to the buried power line BP, the through structure VS, and first wiring portions ML1 (PL1) and ML1 (PL2). Similarly, in the second standard cell SC2, the contact structures CA2 may include a first contact portion connected to the source/drain regions 120 and a second contact portion connected to the buried power line BP. The second contact portion 150B of the first standard cell SC1 may be spaced apart from the second contact portion of the second standard cell SC2.

The through structure VS may include a through via 255 extending from a lower surface of the substrate 101 toward an upper surface of the substrate 101, and an insulating liner 251 disposed between the through via 255 and the substrate 101. The through structure VS may be, for example, a through-silicon-via (TSV). The through structure VS may be formed from a rear surface of the substrate 101, and may be connected to the buried power line BP.

In this embodiment, a contact structure CA connected to a plurality of devices (e.g., source/drain regions 120, etc.) formed on the substrate 101 may be connected to a first wiring portion ML1, located on the rear surface of the substrate 101, by the buried power line BP and the through structure VS. A second wiring portion connected through separate conductive vias may be further disposed below the first wiring portion ML1. The second wiring portion may be a power supply line and signal supply lines, implemented on the rear surface of the substrate 101, and can be understood as a wiring structure that replaces a portion of a necessary BEOL.

Figure 13:
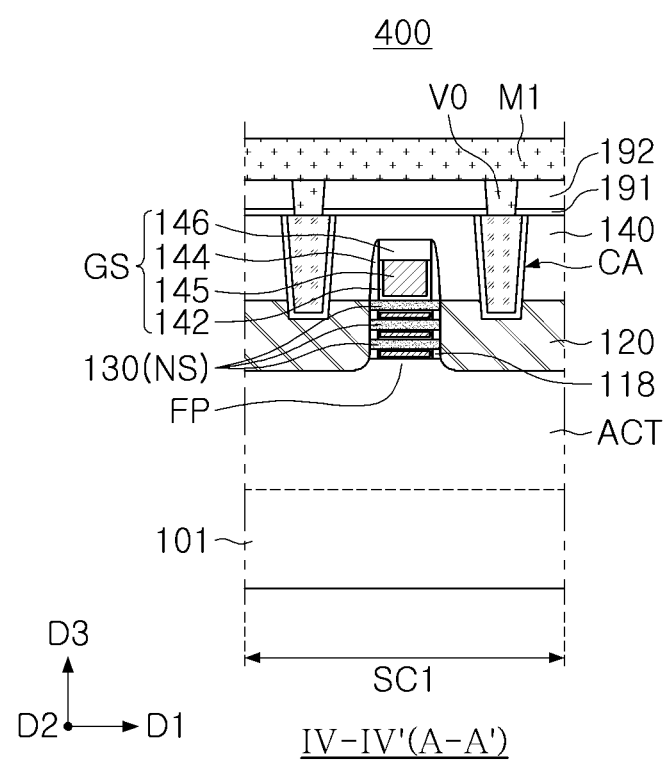
FIG. 13 is a cross-sectional view illustrating a semiconductor device according to an embodiment.

FIG. 13 is a cross-sectional view illustrating a semiconductor device according to example embodiments. FIG. 13 illustrates a region corresponding to a cross-section taken along line A-A' intersecting the gate structure GS in FIG. 6, and illustrates a cross-section intersecting a plurality of channel layers 130 (e.g., NS in FIG. 6) disposed in an N-type device region and a P-type device region in the first direction D1. FIG. 13 can be understood as being a region corresponding to a cross-section taken along line IV-IV' of FIG. 9B in an embodiment in which the plurality of channel layers 130 (e.g., NS in FIG. 6) are formed in standard cells SC1 and SC2 of FIG. 9B.

Referring to FIG. 13, a semiconductor device 400 may further include a plurality of channel layers 130 (e.g., NS in FIG. 6), spaced apart from each other, on a base active region ACT, and internal spacer layers 118 disposed between the plurality of channel layers 130 and parallel to a gate electrode layer 145. The semiconductor device 400 may include transistors having a gate-all-around type FET (GAAFET) structure in which a gate structure GS is disposed between fin patterns FP and channel layers 130, having a nano-sheet form, and between a plurality of channel layers 130. For example, the semiconductor device 400 may include transistors having a multi-bridge channel FET (MBCFET™) structure in which channel layers 130, source/drain regions 120, and a gate structure GS are provided.

The plurality of channel layers 130 may be disposed as two or more of channel layers spaced apart from each other on fin patterns FP in a direction, perpendicular to upper surfaces of the fin patterns FP, for example, in the third direction D3. The channel layers 130 may be connected to source/drain regions 120, and may be spaced apart from the upper surfaces of the fin patterns FP. The plurality of channel layers 130 may be formed of a semiconductor material, and may include, for example, at least one of silicon (Si), silicon germanium (SiGe), and germanium (Ge). The channel layers 130 may be formed of, for example, the same material as a substrate 101. The number and shape of the channel layers 130 forming a single channel structure may be variously changed in embodiments.

The source/drain regions 120 may be formed by performing a selective epitaxial growth process, after recessing the active structures including the channel layers NS on both sides of the gate structure GS of FIG. 6.

Referring to FIG. 6 together, the plurality of channel layers 130 may include first channel layers and second channel layers included in a first standard cell SC1. A first width W1a of the first channel layers in the second direction D2 may be different from a second width W1b of the second channel layers in the second direction D2. The first width W1a and the second width W1b may be changed according to a height of the P-type device region and a height of the N-type device region in the first standard cell SC1.

Referring to FIG. 6 together, the plurality of channel layers 130 may include third channel layers and fourth channel layers included in the second standard cell SC2. A third width W2a of the third channel layers in the second direction D2 may be different from a fourth width W2b of the fourth channel layers in the second direction D2. The third width W2a and the fourth width W2b may be changed according to a height of the P-type device region and a height of the N-type device region in the second standard cell SC2.

The gate structure GS may be disposed on or above the fin patterns FP and the plurality of channel layers 130 to extend to intersect the fin patterns FP and the plurality of channel layers 130. Channel regions of transistors may be formed in the fin patterns FP and the plurality of channel layers 130, intersecting the gate structure GS. In this embodiment, a gate insulating layer 142 may be disposed not only between the fin patterns FP and the gate electrode layer 145, but also between the plurality of channel layers 130 and the gate electrode layer 145. The gate electrode layer 145 may be disposed on the fin patterns FP to fill a space between the plurality of channel layers 130, and may extend over the plurality of channel layers 130. The gate electrode layer 145 may be spaced apart from the plurality of channel layers 130 by the gate insulating layer 142.

The internal spacer layers 118 may be disposed in parallel with the gate electrode layer 145 and between the plurality of channel layers 130. The gate electrode layer 145 may be spaced apart and electrically separated from the source/drain regions 120 by the internal spacer layers 118. The internal spacer layers 118 may have a flat lateral surface opposing the gate electrode layer 145, or may be convexly rounded toward the gate electrode layer 145 in a medial direction. The internal spacer layers 118 may be formed of an oxide, a nitride, and an oxynitride, and in particular, may be formed of a low-k film.

Figure 14:
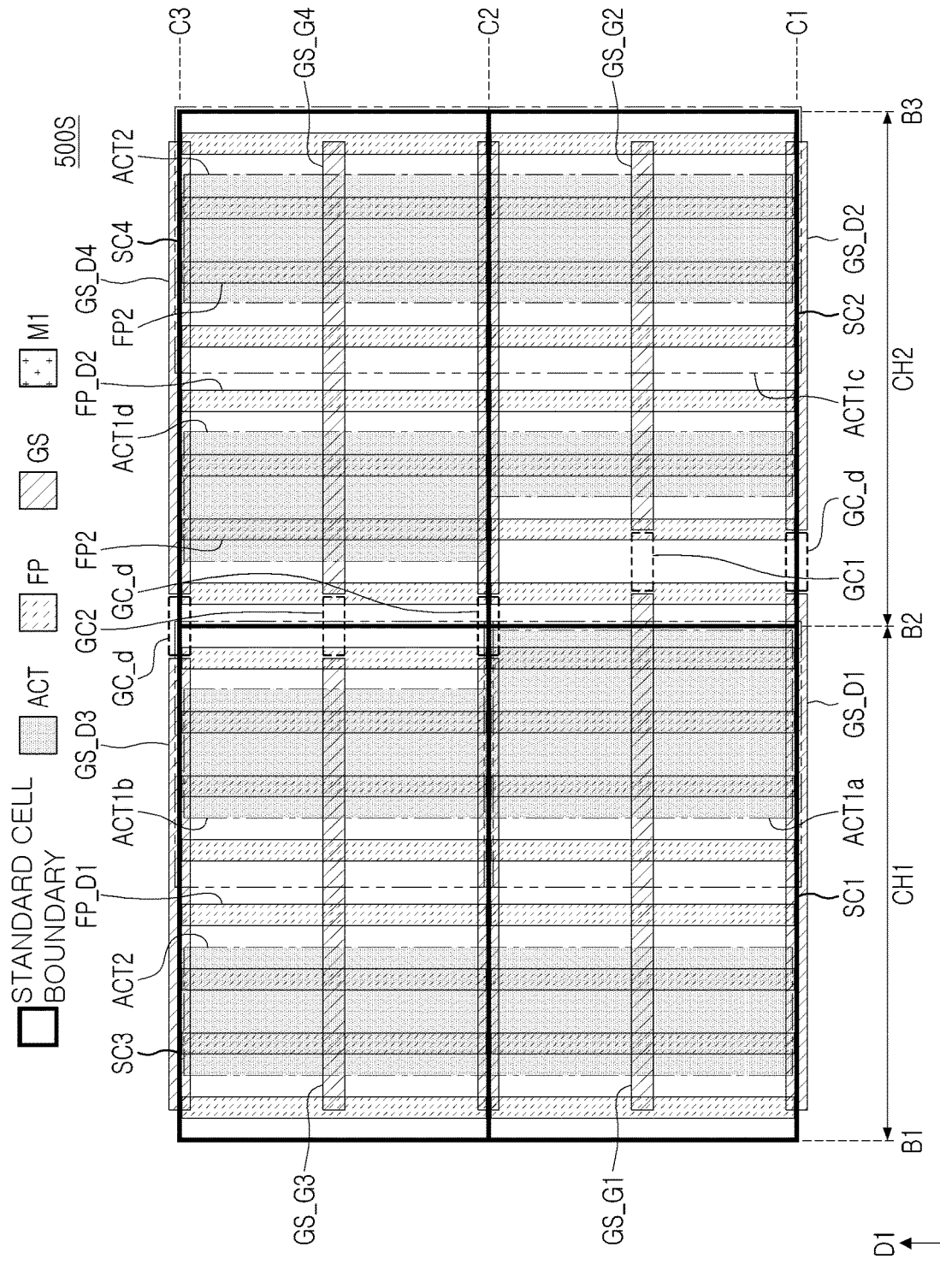
FIG. 14 is a layout diagram illustrating standard cells included in a semiconductor device according to an embodiment.

FIG. 14 is a layout diagram illustrating standard cells included in a semiconductor device according to example embodiments. In FIG. 14, some elements of standard cells will be omitted, but elements of this embodiment can be understood by referring to the descriptions regarding the contact structures CA, the conductive vias V0, the power lines M1 (PL1) and M1 (PL2), and the like of the standard cells 100S and 200S illustrated in FIGS. 8A to 9B, unless otherwise specified.

Referring to FIG. 14, standard cells 500S of a semiconductor device may include a first standard cell SC1 and a second standard cell SC2, arranged in a row adjacent to each other, and a third standard cell SC3 and a fourth standard cell SC4, arranged in a row adjacent to each other in a different column. The first standard cell SC1 may be disposed adjacent to the third standard cell SC3 in the first direction D1, and the second standard cell SC2 may be disposed adjacent to the fourth standard cell SC4 in the first direction D1.

A first gate separation pattern GC1 may be disposed between a first gate structure GS_G1 of the first standard cell SC1 and the second gate structure GS_G2 of the second standard cell SC2. A second gate separation pattern GC2 may be disposed between a third gate structure GS_G3 of the third standard cell SC3 and a fourth gate structure GS_G4 of the fourth standard cell SC4. The first gate separation pattern GC1 and the second gate separation pattern GC2 may be arranged to have a zigzag pattern in the first direction D1. For example, as illustrated in FIG. 14, the first gate separation pattern GC1 may be shifted from a boundary B2 in the second direction D2, but the second gate separation pattern GC2 may be located at the boundary B2. In other words, the position of the first gate separation pattern GC1 in the second direction D2 may be different from the position of the second gate separation pattern GC2 in the second direction D2.

A first base active region ACT1*a* of the first standard cell SC1 and a first base active region ACT1*b* of the third standard cell SC2 may be asymmetric with respect to a boundary C2 in the first direction D1. The boundary C2 may be a boundary between the first standard cell SC1 and the third standard cell SC3. Likewise, a first base active region ACT1*c* of the second standard cell SC2 and a first base active region ACT1*d* of the fourth standard cell SC4 may be asymmetric with respect to the boundary C2 in a first direction D1. The base active regions ACT1*a*, ACT1*b*, ACT1*c*, and ACT1*d* may be asymmetrically arranged, such that the gate separation patterns GC1 and GC2 may also be arranged asymmetrically (for example, have a zigzag pattern) with respect to the boundary C2.

Separation patterns GC_d may be disposed between a first dummy gate structure GS_D1 of the first standard cell SC1 and a second dummy gate structure GS_D2 of the second standard cell SC2. Separation patterns GC_d may also be disposed between a third dummy gate structure GS_D3 of the third standard cell SC3 and a fourth dummy gate structure GS_D4 of the fourth standard cell SC4. The separation patterns GC_d may also be arranged to have a zigzag pattern in the first direction D1.

In example embodiments, a semiconductor device may include a vertical field effect transistor (FET) in which an active region extending perpendicular to an upper surface of a substrate 101 and a gate structure surrounding the active region are arranged in at least one region. Alternatively, a semiconductor device may include a negative capacitance FET (NCFET) using a gate insulating film having ferroelectric properties in at least one region.

Standard cells may be arranged based on a PMOS transistor region and an NMOS transistor region, to design a semiconductor device including standard cells having various cell heights, and provide a semiconductor device with improved electrical characteristics.

A fin pattern disposed at a boundary of standard cells may be used as an active fin pattern, instead of a dummy fin pattern, to provide a semiconductor device having an improved degree of integration and improved reliability.

Various advantages and effects of the disclosure are not limited to the above description, and can be more easily understood in the course of describing specific embodiments of the disclosure.

While example embodiments have been illustrated and described above, it will be apparent to those skilled in the art that modifications and variations could be made without departing from the scope of the disclosure as defined by the appended claims.

What is claimed is:

1. A semiconductor device comprising:
   a first standard cell and a second standard cell, the first standard cell and the second standard cell being disposed on a substrate, each of the first and second standard cells comprising an active region, a plurality of fin patterns disposed on the active region and extending in a first direction, a plurality of gate structures intersecting the plurality of fin patterns and extending in a second direction perpendicular to the first direction, a plurality of source/drain regions disposed on the plurality of fin patterns on both sides of each of the plurality of gate structures, and a contact structure connected to at least one of the plurality of source/drain regions and extending in a vertical direction, wherein the first and second standard cell are arranged in the second direction and shares a boundary with each other;
   a power line disposed on a lower surface of the substrate and overlapping the boundary between the first standard cell and the second standard cell, the power line extending in the first direction;
   a through conductive structure extending from the lower surface of the substrate toward an upper surface of the substrate, and connected to the power line; and
   a buried conductive structure disposed on the substrate, and connected to the through conductive structure,
   wherein the plurality of fin patterns of the first standard cell comprises an external fin pattern overlapping the power line in the vertical direction,
   wherein the buried conductive structure is electrically connected to the contact structure and supplies power to the first standard cell and the second standard cell.

2. The semiconductor device of claim 1, further comprising a device isolation layer disposed on the substrate, and defining the active region and the plurality of fin patterns.

3. The semiconductor device of claim 2, wherein the buried conductive structure is buried in the device isolation layer.

4. The semiconductor device of claim 3, wherein the buried conductive structure is located between the active region of the first standard cell and the active region of the second standard cell.

5. The semiconductor device of claim 1, wherein the buried conductive structure extends in the second direction.

6. The semiconductor device of claim 1, wherein the buried conductive structure has a portion extending into the substrate, and connected to the through conductive structure in the substrate.

7. The semiconductor device of claim 1, wherein the contact structure comprises an extension portion extending in the second direction, and connected to the buried conductive structure.

8. The semiconductor device of claim 1, wherein the plurality of gate structures comprises at least one gate structure extending from the first standard cell to pass through the boundary between the first standard cell and the second standard cell.

9. The semiconductor device of claim 1, wherein the through conductive structure includes a conductive via extending from the lower surface of the substrate toward the upper surface of the substrate, and an insulating liner disposed between the conductive via and the substrate.

10. A semiconductor device comprising:
    a plurality of standard cells arranged in a second direction on a substrate, each of the plurality of standard cells comprising two active regions, a plurality of fin patterns disposed on each of the two active regions and extending in a first direction perpendicular to the second direction, a plurality of gate structures intersecting the plurality of fin patterns and extending in the second direction, a plurality of source/drain regions disposed on the plurality of fin patterns on both sides of each of the plurality of gate structures, a contact structure connected to at least one of the plurality of source/drain regions;

a device isolation layer disposed on the substrate, and defining the two active regions and the plurality of fin patterns in each of the plurality of standard cells;

power lines disposed on a lower surface of the substrate, and extending in the first direction, the power lines arranged in a first pitch corresponding to a cell height of each of the plurality of standard cells;

through conductive structures respectively connected to the power lines, and extending toward an upper surface of the substrate between adjacent active regions of adjacent standard cells of the plurality of standard cells, the through conductive structures arranged in a second pitch different from the first pitch; and buried conductive structures buried in the device isolation layer, and respectively connected to the through conductive structure, each of the buried conductive structures electrically connected to the contact structure.

11. The semiconductor device of claim 10, wherein the through conductive structures comprises a first through conductive structure disposed on a first power line among the power lines, and the first through conductive structure is shifted in the first direction from a center of the first power line.

12. The semiconductor device of claim 11, wherein the through conductive structures comprises a second through conductive structure disposed on a second power line among the power lines, and wherein the second through conductive structure is shifted from a center of the second power line in a direction opposite to the first direction or is located at the center of the second power line.

13. The semiconductor device of claim 10, wherein the plurality of standard cells include first and second standard cells having different cell heights.

14. The semiconductor device of claim 10, wherein the plurality of standard cells include first and second standard cells having adjacent to each other.

15. The semiconductor device of claim 14, wherein the plurality of fin patterns of the first standard cell include an external fin pattern adjacent to the second standard cell, and the external fin pattern overlaps a corresponding power line among the power lines in a vertical direction.

16. The semiconductor device of claim 14, wherein the plurality of gate structures comprises at least one gate structure extending from the first standard cell onto the second standard cell.

17. The semiconductor device of claim 10, wherein the buried conductive structure extends in the second direction.

18. The semiconductor device of claim 10, wherein the contact structure comprises an extension portion extending in the second direction, and connected to each of the buried conductive structures.

19. The semiconductor device of claim 10, wherein each of the through conductive structure include a conductive via extending from the lower surface of the substrate toward the upper surface of the substrate, and an insulating liner disposed between the conductive via and the substrate.

20. A semiconductor device comprising:

a first standard cell and a second standard cell, the first standard cell and the second standard cell disposed on a substrate and having different cell heights, each of the first and second standard cells comprising two active regions, a plurality of fin patterns disposed on each of the two active regions and extending in a first direction, a plurality of gate structures intersecting the plurality of fin patterns and extending in a second direction perpendicular to the first direction, a plurality of source/drain regions disposed on the plurality of fin patterns on both sides of each of the plurality of gate structures, and a contact structure connected to at least one of the plurality of source/drain regions, wherein the first and second standard cells are arranged in the second direction;

a device isolation layer disposed on the substrate, and defining the two active regions and the plurality of fin patterns in each of the first and second standard cells;

power lines disposed on a lower surface of the substrate and extending in the first direction, the power lines arranged on the boundaries of the first and second standard cells extending in the first direction;

through conductive structures respectively connected to the power lines, and extending toward an upper surface of the substrate; and buried conductive structures buried in the device isolation layer, and respectively connected to the through conductive structure, each of the buried conductive structures electrically connected to the contact structure, wherein the through conductive structures include an offset through conductive structure between adjacent active regions of the first and second standard cells, and the offset through conductive structure is shifted in the first direction from a center of a corresponding power line among the power lines, and wherein the plurality of fin patterns of the first or the second standard cell comprises an external fin pattern overlapping the corresponding power line in a vertical direction.

* * * * *